United States Patent
Isobe et al.

(10) Patent No.: US 9,082,663 B2
(45) Date of Patent: Jul. 14, 2015

(54) SEMICONDUCTOR DEVICE AND MANUFACTURING METHOD THEREOF

(75) Inventors: Atsuo Isobe, Isehara (JP); Toshinari Sasaki, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 140 days.

(21) Appl. No.: 13/608,042

(22) Filed: Sep. 10, 2012

(65) Prior Publication Data

US 2013/0069054 A1 Mar. 21, 2013

(30) Foreign Application Priority Data

Sep. 16, 2011 (JP) ................................. 2011-202940

(51) Int. Cl.
*H01L 29/78* (2006.01)
*H01L 21/336* (2006.01)
*H01L 27/12* (2006.01)
*H01L 29/417* (2006.01)
*H01L 29/786* (2006.01)

(52) U.S. Cl.
CPC ...... *H01L 27/1225* (2013.01); *H01L 29/41733* (2013.01); *H01L 29/7869* (2013.01); *H01L 29/78618* (2013.01)

(58) Field of Classification Search
USPC .............. 257/40, 43, 52, 57, 59, 72, E21.409, 257/E29.255; 438/104
See application file for complete search history.

(56) References Cited

U.S. PATENT DOCUMENTS

| | | | |
|---|---|---|---|
| 4,862,237 A | 8/1989 | Morozumi et al. | |
| 5,208,476 A | 5/1993 | Inoue | |
| 5,372,958 A | 12/1994 | Miyasaka et al. | |
| 5,482,870 A | 1/1996 | Inoue | |
| 5,528,032 A | 6/1996 | Uchiyama | |
| 5,561,075 A | 10/1996 | Nakazawa | |
| 5,583,366 A | 12/1996 | Nakazawa | |

(Continued)

FOREIGN PATENT DOCUMENTS

| | | |
|---|---|---|
| EP | 1209748 A | 5/2002 |
| EP | 1443130 A | 8/2004 |

(Continued)

OTHER PUBLICATIONS

Morosawa et al., "35.3: Distinguished Paper: A Novel Self-Aligned Top-Gate Oxide TFT for AM-OLED Displays," SID Digest '11: SID International Symposium Digest of Technical Papers, May 17, 2011, pp. 479-482.

(Continued)

*Primary Examiner* — Lynne Gurley
*Assistant Examiner* — Vernon P Webb
(74) *Attorney, Agent, or Firm* — Eric J. Robinson; Robinson Intellectual Property Law Office, P.C.

(57) ABSTRACT

In a semiconductor device including an oxide semiconductor layer, a conductive layer is formed in contact with a lower portion of the oxide semiconductor layer and treatment for adding an impurity is performed, so that a channel formation region and a pair of low-resistance regions between which the channel formation region is sandwiched are formed in the oxide semiconductor layer in a self-aligned manner. Wiring layers electrically connected to the conductive layer and the low-resistance regions are provided in openings of an insulating layer.

15 Claims, 14 Drawing Sheets

(56) References Cited

U.S. PATENT DOCUMENTS

| | | |
|---|---|---|
| 5,614,730 A | 3/1997 | Nakazawa et al. |
| 5,731,856 A | 3/1998 | Kim et al. |
| 5,744,864 A | 4/1998 | Cillessen et al. |
| 5,814,539 A | 9/1998 | Nakazawa |
| 5,817,548 A | 10/1998 | Noguchi et al. |
| 5,943,593 A | 8/1999 | Noguchi et al. |
| 6,087,679 A | 7/2000 | Yamazaki et al. |
| 6,136,625 A | 10/2000 | Nakazawa |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,205,640 B2 | 4/2007 | Yoshioka et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,598,520 B2 | 10/2009 | Hirao et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,993,964 B2 | 8/2011 | Hirao et al. |
| 8,003,981 B2 | 8/2011 | Iwasaki et al. |
| 8,093,589 B2 | 1/2012 | Sugihara et al. |
| 8,158,976 B2 | 4/2012 | Son et al. |
| 8,164,090 B2 | 4/2012 | Iwasaki et al. |
| 8,314,032 B2 | 11/2012 | Kawamura et al. |
| 8,384,076 B2 | 2/2013 | Park et al. |
| 8,395,931 B2 | 3/2013 | Yamazaki et al. |
| 8,399,882 B2 | 3/2013 | Jeon et al. |
| 8,445,902 B2 | 5/2013 | Sato et al. |
| 8,481,377 B2 | 7/2013 | Akimoto et al. |
| 8,513,661 B2 | 8/2013 | Takahashi et al. |
| 8,530,273 B2 | 9/2013 | Den Boer |
| 8,618,537 B2 | 12/2013 | Kaneko et al. |
| 8,624,240 B2 | 1/2014 | Sato et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0039670 A1 | 2/2005 | Hosono et al. |
| 2005/0173734 A1 | 8/2005 | Yoshioka et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0278490 A1 | 12/2007 | Hirao et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0116500 A1 | 5/2008 | Tokunaga |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0277656 A1 | 11/2008 | Park et al. |
| 2008/0283923 A1* | 11/2008 | Li et al. .......... 257/365 |
| 2008/0296568 A1 | 12/2008 | Ryu et al. |
| 2009/0008645 A1 | 1/2009 | Yamazaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0065844 A1 | 3/2010 | Tokunaga |
| 2010/0084650 A1* | 4/2010 | Yamazaki et al. .......... 257/43 |
| 2010/0084655 A1 | 4/2010 | Iwasaki et al. |
| 2010/0092800 A1 | 4/2010 | Itagaki et al. |
| 2010/0109002 A1 | 5/2010 | Itagaki et al. |
| 2010/0117073 A1 | 5/2010 | Yamazaki et al. |
| 2010/0159639 A1 | 6/2010 | Sakata |
| 2010/0224871 A1 | 9/2010 | Yamaguchi et al. |
| 2011/0095288 A1 | 4/2011 | Morosawa |
| 2011/0147738 A1 | 6/2011 | Yamazaki et al. |
| 2011/0175090 A1 | 7/2011 | Sugihara et al. |
| 2011/0182110 A1 | 7/2011 | Yamazaki et al. |
| 2011/0204362 A1 | 8/2011 | Akimoto et al. |
| 2011/0280061 A1 | 11/2011 | Saito et al. |
| 2012/0001167 A1 | 1/2012 | Morosawa |
| 2012/0119212 A1 | 5/2012 | Endo et al. |
| 2012/0161121 A1 | 6/2012 | Yamazaki |
| 2012/0161122 A1 | 6/2012 | Yamazaki |
| 2012/0161123 A1 | 6/2012 | Yamazaki |
| 2012/0161124 A1 | 6/2012 | Yamazaki |
| 2012/0161125 A1 | 6/2012 | Yamazaki |
| 2012/0161126 A1 | 6/2012 | Yamazaki |
| 2012/0242627 A1 | 9/2012 | Kim et al. |
| 2012/0315730 A1 | 12/2012 | Koezuka et al. |
| 2012/0315735 A1 | 12/2012 | Koezuka et al. |
| 2013/0037793 A1 | 2/2013 | Pan et al. |
| 2013/0056727 A1 | 3/2013 | Yamade et al. |
| 2013/0069053 A1 | 3/2013 | Yamazaki et al. |

(56) References Cited

U.S. PATENT DOCUMENTS

| | | |
|---|---|---|
| 2013/0069055 A1 | 3/2013 | Yamazaki et al. |
| 2013/0127694 A1 | 5/2013 | Kim et al. |
| 2013/0309808 A1 | 11/2013 | Zhang et al. |

FOREIGN PATENT DOCUMENTS

| | | |
|---|---|---|
| EP | 1737044 A | 12/2006 |
| EP | 2120267 A | 11/2009 |
| EP | 2175493 A | 4/2010 |
| EP | 2226847 A | 9/2010 |
| EP | 2408011 A | 1/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2007-123861 A | 5/2007 |
| JP | 2007-220816 A | 8/2007 |
| JP | 2008-277665 A | 11/2008 |
| JP | 2010-135774 A | 6/2010 |
| WO | WO-2004/114391 | 12/2004 |
| WO | WO-2010/001783 | 1/2010 |
| WO | WO-2011/074407 | 6/2011 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUs on Glass and Plastic Substrates Fabricated by TFT Transfer Technology,", IEDM 05: Techincal Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TTFs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness proved using single-crystalline $InGaO_3(ZnO)5$ films,", Appl. Phys. Lett. (Applied Physics Letters), Sep. 13, 2004, vol. 84, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Ads. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPSs on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

(56) References Cited

OTHER PUBLICATIONS

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium13 Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium digest of Techincal Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec, 7, 2006, pp. 663-666

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound With New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys.Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B(Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

(56) References Cited

OTHER PUBLICATIONS

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

Kim.S et al., "Source/Drain Formation of Self-Aligned Top-Gate Amorphous GaInZnO Thin-Film Transistors by NH3 Plasma Treatment", IEEE Electron Device Letters, Apr. 1, 2009, vol. 30, No. 4, pp. 374-376.

Ahn.B et al., "Comparison of the effects of Ar and H2 plasmas on the performance of homojunctioned amorphous indium gallium zinc oxide thin film transistors", Appl. Phys. Lett. (Applied Physics Letters), 2008, vol. 93, No. 20, pp. 203506-1-203506-3.

\* cited by examiner

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

In this specification, a semiconductor device generally means any device which can function by utilizing semiconductor characteristics, and an electro-optic device, a semiconductor circuit, and an electronic appliance are all included in the category of the semiconductor device.

2. Description of the Related Art

A technique by which transistors are formed using semiconductor thin films formed over a substrate having an insulating surface has attracted attention. The transistor is applied to a wide range of electronic devices such as an integrated circuit (IC) and an image display device (display device). A silicon-based semiconductor material is widely known as a material for a semiconductor thin film applicable to the transistor; in addition, an oxide semiconductor has attracted attention as another material.

For example, a transistor whose active layer includes an amorphous oxide containing indium (In), gallium (Ga), and zinc (Zn) and having an electron carrier concentration of less than $10^{18}/cm^3$ is disclosed (see Patent Document 1).

REFERENCE

Patent Document

[Patent Document 1] Japanese Published Patent Application No. 2006-165528

SUMMARY OF THE INVENTION

In order to achieve high-speed operation, low power consumption, high integration, cost reduction, or the like of a transistor, it is necessary to miniaturize a transistor. In the case of forming a miniaturized transistor, the contact area between the semiconductor layer and the conductive layer in contact with the semiconductor layer is small; as a result, the influence of the contact resistance becomes significantly large.

When the contact resistance is increased, the on-state current, which is one of electric characteristics of a transistor, is reduced and the field-effect mobility is decreased. One of factors causing high contact resistance is Schottky junction that is formed at a contact surface between the conductive layer and the semiconductor layer.

An object of one embodiment of the present invention is to provide a semiconductor device which maintains favorable electric characteristics and achieves miniaturization, and a method for manufacturing the semiconductor device.

In order to achieve the above object, in a transistor (semiconductor device) including an oxide semiconductor layer of one embodiment of the present invention, an electrode layer is formed in contact with a lower portion of the oxide semiconductor layer and treatment for adding an impurity is performed on the oxide semiconductor layer with the use of a gate electrode layer as a mask, whereby a channel formation region and a pair of low-resistance regions between which the channel formation region is sandwiched are formed in the oxide semiconductor layer in a self-aligned manner. Wiring layers electrically connected to the electrode layer and the low-resistance regions are formed in openings of an insulating layer.

According to one embodiment of the present invention, a semiconductor device includes a base insulating layer, an electrode layer whose bottom surface and side surface are provided in the base insulating layer and upper surface is exposed, an oxide semiconductor layer formed over the base insulating layer and the electrode layer, which includes a channel formation region and a first low-resistance region and a second low-resistance region between which the channel formation region is sandwiched and in which the channel formation region is in contact with the base insulating layer and the first low-resistance region is in contact with the electrode layer, a gate insulating layer formed over the electrode layer, the oxide semiconductor layer, and the base insulating layer, a gate electrode layer formed over the gate insulating layer and overlapping with the channel formation region, an insulating layer formed over the gate insulating layer and the gate electrode layer, a first wiring layer overlapping with the electrode layer, formed in a first opening reaching the electrode layer, and being in contact with the electrode layer, a second wiring layer overlapping with the first low-resistance region, formed in a second opening reaching the first low-resistance region, and being in contact with the first low-resistance region, and a third wiring layer formed in a third opening and electrically connected to the second low-resistance region. The third opening is provided so as to face the second opening with the gate electrode layer provided between the third opening and the second opening.

According to one embodiment of the present invention, a semiconductor device includes a base insulating layer, an electrode layer whose bottom surface and side surface are provided in the base insulating layer and upper surface is exposed, an oxide semiconductor layer formed over the base insulating layer and the electrode layer, which includes a channel formation region and a first low-resistance region and a second low-resistance region between which the channel formation region is sandwiched and in which the channel formation region is in contact with the base insulating layer and the first low-resistance region is in contact with the electrode layer, a gate insulating layer formed over the electrode layer, the oxide semiconductor layer, and the base insulating layer, a gate electrode layer formed over the gate insulating layer and overlapping with the channel formation region, an insulating layer formed over the gate insulating layer and the gate electrode layer, a first wiring layer overlapping with the electrode layer, formed in a first opening reaching the electrode layer, and being in contact with the electrode layer, a second wiring layer overlapping with the first low-resistance region, formed in a second opening reaching the first low-resistance region, and being in contact with the first low-resistance region, and a third wiring layer overlapping with the second low-resistance region, formed in a third opening reaching the second low-resistance region, and being in contact with the second low-resistance region.

According to one embodiment of the present invention, a semiconductor device includes a base insulating layer, a first electrode layer and a second electrode layer whose bottom surfaces and side surface are provided in the base insulating layer and upper surfaces are exposed, an oxide semiconductor layer formed over the base insulating layer, the first electrode layer, and the second electrode layer, which includes a channel formation region and a first low-resistance region and a second low-resistance region between which the channel formation region is sandwiched and in which the channel formation region is in contact with the base insulating layer, the first low-resistance region is in contact with the first electrode layer, and the second low-resistance region is in contact with the second electrode layer, a gate insulating layer formed over the first electrode layer, the second electrode layer, the oxide semiconductor layer, and the base insulating layer, a gate electrode layer formed over the gate insulating layer and overlapping with the channel formation region, an insulating layer formed over the gate insulating layer and the gate electrode layer, a first wiring layer overlapping with the first electrode layer, formed in a first opening reaching the first electrode layer, and being in contact with the first electrode layer, a second wiring layer overlapping with the first low-resistance region, formed in a second opening reaching the first low-resistance region, and being in contact with the first low-resistance region, and a third wiring layer overlapping with the second electrode layer, formed in a third opening reaching the second electrode layer, and being in contact with the second electrode layer.

According to one embodiment of the present invention, a semiconductor device includes a base insulating layer, a first electrode layer and a second electrode layer whose bottom surfaces and side surface are provided in the base insulating layer and upper surfaces are exposed, an oxide semiconductor layer formed over the base insulating layer, the first electrode layer, and the second electrode layer, which includes a channel formation region and a first low-resistance region and a second low-resistance region between which the channel formation region is sandwiched and in which the channel formation region is in contact with the base insulating layer, the first low-resistance region is in contact with the first electrode layer, and the second low-resistance region is in contact with the second electrode layer, a gate insulating layer formed over the first electrode layer, the second electrode layer, the oxide semiconductor layer, and the base insulating layer, a gate electrode layer formed over the gate insulating layer and overlapping with the channel formation region, an insulating layer formed over the gate insulating layer and the gate electrode layer, a first wiring layer overlapping with the first electrode layer, formed in a first opening reaching the first electrode layer, and being in contact with the first electrode layer, a second wiring layer overlapping with the first electrode layer and the first low-resistance region, formed in a second opening reaching the first low-resistance region, and being in contact with the first low-resistance region, and a third wiring layer overlapping with the second electrode layer and the second low-resistance region, formed in a third opening reaching the second low-resistance region, and being in contact with the second low-resistance region.

According to one embodiment of the present invention, a semiconductor device includes a base insulating layer, a first electrode layer and a second electrode layer whose bottom surfaces and side surface are provided in the base insulating layer and upper surfaces are exposed, an oxide semiconductor layer formed over the base insulating layer, the first electrode layer, and the second electrode layer, which includes a channel formation region and a first low-resistance region and a second low-resistance region between which the channel formation region is sandwiched and in which the channel formation region is in contact with the base insulating layer, the first low-resistance region is in contact with the first electrode layer, and the second low-resistance region is in contact with the second electrode layer, a gate insulating layer formed over the first electrode layer, the second electrode layer, the oxide semiconductor layer, and the base insulating layer, a gate electrode layer formed over the gate insulating layer and overlapping with the channel formation region, an insulating layer formed over the gate insulating layer and the gate electrode layer, a first wiring layer overlapping with the first electrode layer, formed in a first opening reaching the first electrode layer, and being in contact with the first electrode layer, a second wiring layer overlapping with the first electrode layer and the first low-resistance region, formed in a second opening reaching the first low-resistance region, and being in contact with the first low-resistance region, and a third wiring layer overlapping with the second electrode layer and the second low-resistance region, formed in a third opening reaching the second electrode layer, and being in contact with the second electrode layer.

According to one embodiment of the present invention, in the above structure, the oxide semiconductor layer preferably includes a c-axis-aligned crystal region.

According to one embodiment of the present invention, in the above structure, the same potential is preferably supplied to the first wiring layer and the second wiring layer.

According to one embodiment of the present invention, a method for manufacturing a semiconductor device includes the following steps: forming an electrode layer over an insulating surface; forming a base insulating layer over the electrode layer; exposing an upper surface of the electrode layer; forming an oxide semiconductor layer over the base insulating layer and the electrode layer; forming a gate insulating layer over the electrode layer, the oxide semiconductor layer, and the base insulating layer; forming a gate electrode layer over the gate insulating layer; adding an impurity so that in a self-aligned manner, a channel formation region is formed in a region of the oxide semiconductor layer which overlaps with the gate electrode layer and a first low-resistance region and a second low-resistance region are formed in the oxide semiconductor layer so that the channel formation region is sandwiched between the first low-resistance region and the second low-resistance region; forming an insulating layer over the gate insulating layer and the gate electrode layer; forming a first opening overlapping with the electrode layer and reaching the electrode layer; forming a second opening overlapping with the first low-resistance region and reaching the first low-resistance region; forming a third opening provided so that the gate electrode layer is provided between the third opening and the second opening; forming a first wiring layer in contact with the electrode layer in the first opening; forming a second wiring layer in contact with the first low-resistance region in the second opening; and forming a third wiring layer electrically connected to the second low-resistance region in the third opening. The first low-resistance region is in contact with the electrode layer.

According to one embodiment of the present invention, a method for manufacturing a semiconductor device includes the following steps: forming an electrode layer over an insulating surface; forming a base insulating layer over the electrode layer; exposing an upper surface of the electrode layer; forming an oxide semiconductor layer over the base insulating layer and the electrode layer; forming a gate insulating layer over the electrode layer, the oxide semiconductor layer, and the base insulating layer; forming a gate electrode layer over the gate insulating layer; adding an impurity so that in a self-aligned manner, a channel formation region is formed in a region of the oxide semiconductor layer which overlaps with the gate electrode layer, and a first low-resistance region and a second low-resistance region are formed in the oxide semiconductor layer so that the channel formation region is sandwiched between the first low-resistance region and the second low-resistance region; forming an insulating layer over the gate insulating layer and the gate electrode layer; forming a first opening overlapping with the electrode layer and reaching the electrode layer; forming a second opening overlapping with the first low-resistance region and reaching the first low-resistance region; forming a third opening overlapping with the second low-resistance region and reaching the second low-resistance region; forming a first wiring layer in contact with the electrode layer in the first opening; forming a second wiring layer in contact with the first low-resistance region in the second opening; and forming a third wiring layer in contact with the second low-resistance region in the third opening. The first low-resistance region is in contact with the electrode layer.

According to one embodiment of the present invention, a method for manufacturing a semiconductor device includes the following steps: forming a first electrode layer and a second electrode layer over an insulating surface; forming a base insulating layer over the first electrode layer and the second electrode layer; exposing an upper surface of the first electrode layer and an upper surface of the second electrode layer; forming an oxide semiconductor layer over the base insulating layer, the first electrode layer, and the second electrode layer; forming a gate insulating layer over the first electrode layer, the second electrode layer, the oxide semiconductor layer, and the base insulating layer; forming a gate electrode layer over the gate insulating layer; adding an impurity so that in a self-aligned manner, a channel formation region is formed in a region of the oxide semiconductor layer which overlaps with the gate electrode layer, and a first low-resistance region and a second low-resistance region are formed in the oxide semiconductor layer so that the channel formation region is sandwiched between the first low-resistance region and the second low-resistance region; forming an insulating layer over the gate insulating layer and the gate electrode layer; forming a first opening overlapping with the first electrode layer and reaching the first electrode layer; forming a second opening overlapping with the first low-resistance region and reaching the first low-resistance region; forming a third opening overlapping with the second electrode layer and reaching the second electrode layer; forming a first wiring layer in contact with the first electrode layer in the first opening; forming a second wiring layer in contact with the first low-resistance region in the second opening; and forming a third wiring layer in contact with the second electrode layer in the third opening. The first low-resistance region is in contact with the first electrode layer, and the second low-resistance region is in contact with the second electrode layer.

According to one embodiment of the present invention, a method for manufacturing a semiconductor device includes the following steps: forming a first electrode layer and a second electrode layer over an insulating surface; forming a base insulating layer over the first electrode layer and the second electrode layer; exposing an upper surface of the first electrode layer and an upper surface of the second electrode layer; forming an oxide semiconductor layer over the base insulating layer, the first electrode layer, and the second electrode layer; forming a gate insulating layer over the first electrode layer, the second electrode layer, the oxide semiconductor layer, and the base insulating layer; forming a gate electrode layer over the gate insulating layer; adding an impurity so that in a self-aligned manner, a channel formation region is formed in a region of the oxide semiconductor layer which overlaps with the gate electrode layer, and a first low-resistance region and a second low-resistance region are formed in the oxide semiconductor layer so that the channel formation region is sandwiched between the first low-resistance region and the second low-resistance region; forming an insulating layer over the gate insulating layer and the gate electrode layer; forming a first opening overlapping with the first electrode layer and reaching the first electrode layer; forming a second opening overlapping with the first electrode layer and the first low-resistance region and reaching the first low-resistance region; forming a third opening overlapping with the second electrode layer and the second low-resistance region and reaching the second low-resistance region; forming a first wiring layer in contact with the first electrode layer in the first opening; forming a second wiring layer in contact with the first low-resistance region in the second opening; and forming a third wiring layer in contact with the second electrode layer in the third opening. The first low-resistance region is in contact with the first electrode layer, and the second low-resistance region is in contact with the second electrode layer.

According to one embodiment of the present invention, a method for manufacturing a semiconductor device includes the following steps: forming a first electrode layer and a second electrode layer over an insulating surface; forming a base insulating layer over the first electrode layer and the second electrode layer; exposing an upper surface of the first electrode layer and an upper surface of the second electrode layer; forming an oxide semiconductor layer over the base insulating layer, the first electrode layer, and the second electrode layer; forming a gate insulating layer over the first electrode layer, the second electrode layer, the oxide semiconductor layer, and the base insulating layer; forming a gate electrode layer over the gate insulating layer; adding an impurity so that in a self-aligned manner, a channel formation region is formed in a region of the oxide semiconductor layer which overlaps with the gate electrode layer and a first low-resistance region and a second low-resistance region are formed in the oxide semiconductor layer so that the channel formation region is sandwiched between the first low-resistance region and the second low-resistance region; forming an insulating layer over the gate insulating layer and the gate electrode layer; forming a first opening overlapping with the first electrode layer and reaching the first electrode layer; forming a second opening overlapping with the first electrode layer and the first low-resistance region and reaching the first low-resistance region; forming a third opening overlapping with the second electrode layer and the second low-resistance region and reaching the second electrode layer; forming a first wiring layer in contact with the first electrode layer in the first opening; forming a second wiring layer in contact with the first low-resistance region in the second opening; and forming a third wiring layer in contact with the second electrode layer in the third opening. The first low-resistance region is in contact with the first electrode layer, and the second low-resistance region is in contact with the second electrode layer.

According to one embodiment of the present invention, in the above manufacturing method, nitrogen plasma treatment is preferably performed on the electrode layer over the insulating surface before the base insulating layer is formed.

According to one embodiment of the present invention, in the above manufacturing method, the impurity is preferably added by an ion doping method or an ion implantation method.

Note that in this specification and the like, the term such as "over" or "below" does not necessarily mean that a component is placed "directly on" or "directly under" another component. For example, the expression "a gate electrode layer over a gate insulating layer" does not exclude the case where a component is placed between the gate insulating layer and the gate electrode layer.

In addition, in this specification and the like, the term such as "electrode layer" or "wiring layer" does not limit a function of a component. For example, an "electrode layer" is sometimes used as part of a "wiring layer", and vice versa. Further, the term "electrode layer" or "wiring layer" can also mean a combination of a plurality of "electrode layers" and "wiring layers", for example.

Functions of a "source" and a "drain" are sometimes replaced with each other when a transistor of opposite polarity is used or when the direction of current flowing is changed in circuit operation, for example. Thus, the terms "source" and "drain" can be replaced with each other in this specification and the like.

Note that in this specification and the like, the term "electrically connected" includes the case where components are connected through an "object having any electric function". There is no particular limitation on an "object having any electric function" as long as electric signals can be transmitted and received between components that are connected through the object.

Examples of an "object having any electric function" include an electrode and a wiring.

In this specification and the like, average surface roughness ($R_a$) is obtained by three-dimensional expansion of arithmetic mean surface roughness that is defined by JIS B 0601: 2001 (ISO4287:1997) so as to be applied to a curved surface, and is an average value of the absolute values of deviations from a reference surface to a specific surface.

When the specific surface is expressed as $Z_0=f(x, y)$, the average surface roughness ($R_a$) is an average value of the absolute values of deviations from the reference surface to the specific surface and is shown by the following formula (I).

$$R_a = \frac{1}{S_0} \int_{y_1}^{y_2} \int_{x_1}^{x_2} |f(x, y) - Z_0| \, dx \, dy \quad (1)$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). $S_0$ represents the area of a rectangle which is obtained by projecting the specific surface on the xy plane, and $Z_0$ represents the height of the reference surface (the average height of the specific surface). The average surface roughness ($R_a$) can be measured using an atomic force microscope (AFM).

According to one embodiment of the present invention, a semiconductor device which maintains favorable electric characteristics and achieves miniaturization, and a manufacturing method thereof can be provided. Further, a semiconductor device in which resistance between a wiring layer and an oxide semiconductor layer is reduced so that a favorable ohmic contact can be obtained, and a manufacturing method thereof can be provided.

Further, according to one embodiment of the present invention, the size of a transistor can be sufficiently reduced. When the size of the transistor is sufficiently reduced, the size of a semiconductor device is also reduced and thus the number of semiconductor devices manufactured from one substrate is increased. Accordingly, manufacturing cost of the semiconductor device can be reduced. Since the semiconductor device is downsized, a semiconductor device with a size similar to that of the conventional semiconductor device can have improved functions. Further, the semiconductor device can be highly integrated. Effects of improvement in on-state current and mobility, high-speed operation, lower power consumption, and the like can be obtained.

DETAILED DESCRIPTION OF THE INVENTION

Figure 1A:
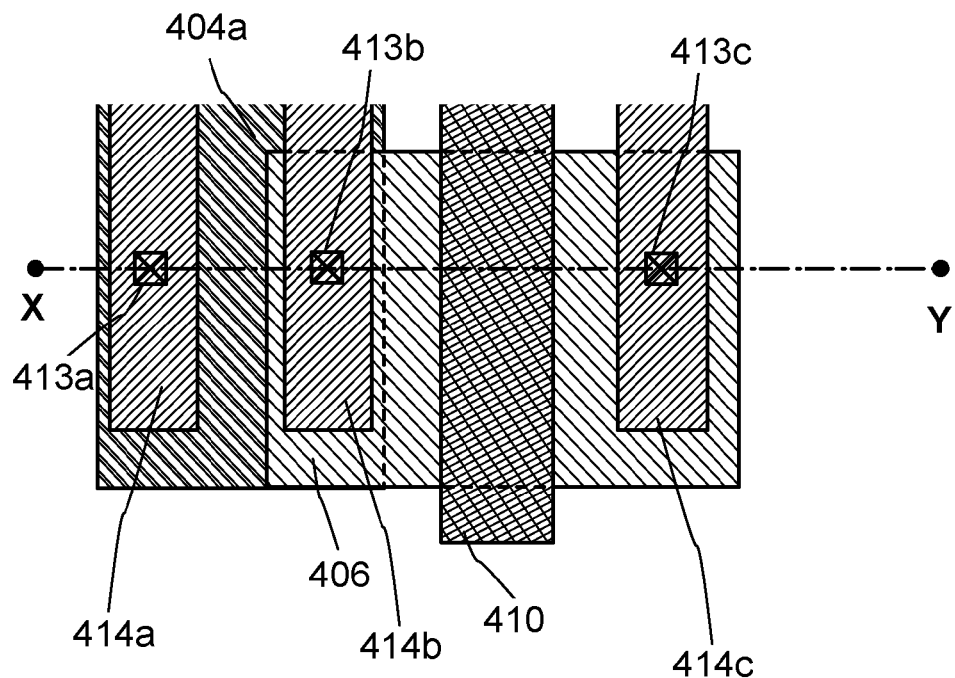
FIGS. 1A and 1B are a plan view and a cross-sectional view illustrating a semiconductor device of one embodiment of the present invention.

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Accordingly, the present invention should not be construed as being limited to the description of the embodiments below. In describing structures of the present invention with reference to the drawings, the same reference numerals are used in common for the same portions in different drawings. The same hatching pattern may be applied to similar parts, and the similar parts may not be especially denoted by reference numerals in some cases. In addition, for convenience, an insulating layer is not illustrated in a top view in some cases.

Furthermore, hereinafter, ordinal numbers, such as "first" and "second," are used merely for convenience, and the present invention is not limited to the numbers.

Embodiment 1

In this embodiment, a semiconductor device which is one embodiment of the present invention and a method for manufacturing the semiconductor device will be described with reference to FIGS. 1A and 1B, FIGS. 2A to 2D, and FIGS. 3A to 3C. In this embodiment, a top gate transistor will be described as an example of the semiconductor device.

Figure 1B:
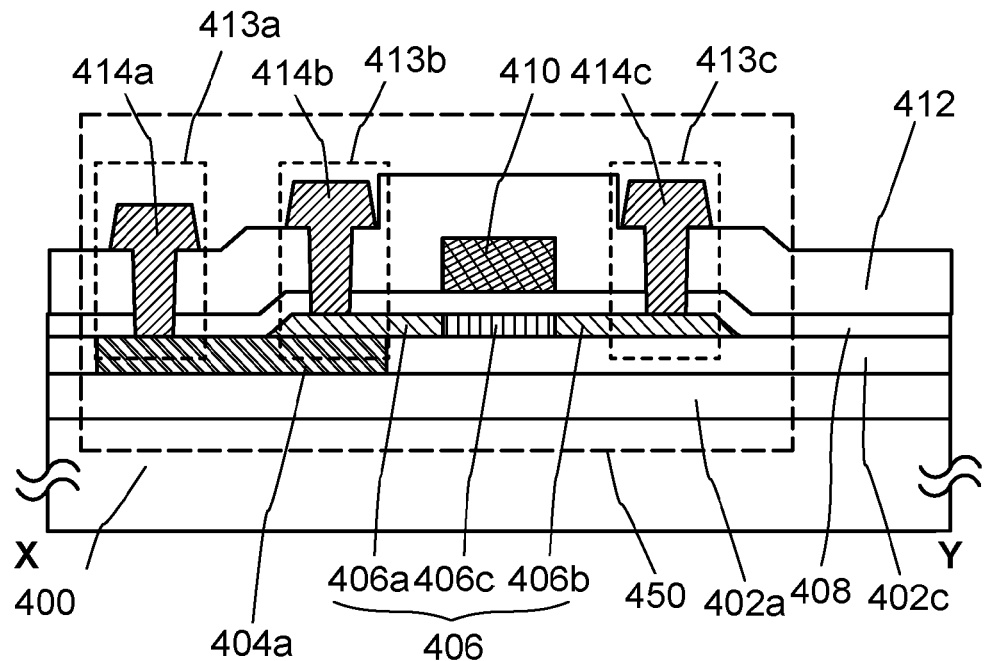

FIGS. 1A and 1B are a plan view and a cross-sectional view of a transistor 450. FIG. 1A is a plan view and FIG. 1B is a cross-sectional view taken along line X-Y in FIG. 1A. Note that in FIG. 1A, some components of the transistor 450 (e.g., an insulating layer 412) are not illustrated for simplicity.

FIGS. 1A and 1B are an example of a structure of a semiconductor device manufactured by a method of this embodiment. The transistor 450 in FIGS. 1A and 1B includes a substrate 400, a base insulating layer 402a, a base insulating layer 402c, an electrode layer 404a, an oxide semiconductor layer 406 including a channel formation region 406c and a low-resistance region 406a and a low-resistance region 406b between which the channel formation region 406c is sandwiched, a gate insulating layer 408, a gate electrode layer 410, the insulating layer 412, a wiring layer 414a, a wiring layer 414b, and a wiring layer 414c.

Here, a positional relation and a connection relation of the above components will be described.

The base insulating layer is a stack of the base insulating layer 402a and the base insulating layer 402c, and the electrode layer 404a is provided in part of a region over the base insulating layer 402a. Note that an upper surface of the electrode layer 404a is in contact with at least part of the low-resistance region 406a and is not in contact with the channel formation region 406c.

The oxide semiconductor layer 406 is formed over the base insulating layer 402c and the electrode layer 404a. The oxide semiconductor layer 406 includes the channel formation region 406c and the low-resistance region 406a and the low-resistance region 406b between which the channel formation region 406c is sandwiched. The low-resistance region 406a is provided in contact with the upper surface of the electrode layer 404a and an upper surface of the base insulating layer 402c, and the low-resistance region 406b and the channel formation region 406c are provided in contact with the upper surface of the base insulating layer 402c. In addition, the low-resistance region 406a and the low-resistance region 406b each serve as a source region or a drain region.

The gate insulating layer 408 is provided over the base insulating layer 402c, the electrode layer 404a, and the oxide semiconductor layer 406, the gate electrode layer 410 is provided in a region over the gate insulating layer 408 which overlaps with the channel formation region 406c, and the insulating layer 412 is provided over the gate insulating layer 408 and the gate electrode layer 410.

The wiring layer 414a is in contact with the electrode layer 404a through an opening 413a overlapping with the electrode layer 404a. The wiring layer 414b is in contact with the low-resistance region 406a through an opening 413b overlapping with the electrode layer 404a and the low-resistance region 406a. The wiring layer 414c is in contact with the low-resistance region 406b through an opening 413c overlapping with the low-resistance region 406b.

An example of a manufacturing process of the transistor 450 will be described below.

Figure 2A:
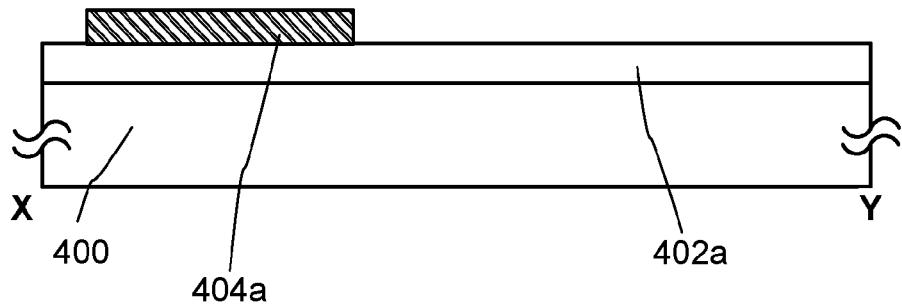
FIGS. 2A to 2D are cross-sectional views illustrating a manufacturing process of a semiconductor device of one embodiment of the present invention.

First, the base insulating layer 402a is formed over the substrate 400 having an insulating surface (see FIG. 2A).

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The base insulating layer 402a is formed by a plasma CVD method or a sputtering method to have a thickness greater than or equal to 150 nm and less than or equal to 200 nm with the use of one of a silicon oxide film, a gallium oxide film, an aluminum oxide film, a silicon nitride film, a silicon oxynitride film, an aluminum oxynitride film, and a silicon nitride oxide film or a stack of any of these films. In the case where the base insulating layer 402a is unnecessary, for example, in the case where the amount of moisture adsorbed on a surface of the substrate 400 and the amount of moisture included in the substrate 400 are small, the base insulating layer 402a is not necessarily provided.

Note that in this specification, "oxynitride" such as silicon oxynitride contains more oxygen than nitrogen.

Further, in this specification, "nitride oxide" such as silicon nitride oxide contains more nitrogen than oxygen.

Next, after a conductive film is formed over the base insulating layer 402a, the electrode layer 404a is formed through a photolithography step and an etching step (see FIG. 2A). The electrode layer 404a is formed using a material that can withstand heat treatment in a later step. The electrode layer 404a is formed to have a thickness greater than or equal to 10 nm and less than or equal to 500 nm with the use of a metal film including an element selected from Al, Cr, Cu, Ta, Ti, Mo, and W, for example. A metal film having a high melting point of Ti, Mo, W, or the like or a metal nitride film of any of these elements (a titanium nitride film, a molybdenum nitride film, or a tungsten nitride film) may be stacked on one of or both a lower side and an upper side of a metal film of Al, Cu, or the like. Alternatively, the electrode layer 404a may be formed using an oxide semiconductor. As the oxide semiconductor, an In—Ga—Zn-based oxide (also referred to as IGZO), indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), or any of these oxide semiconductor materials containing silicon oxide can be used. The electrode layer 404a may have a structure in which a metal film and an oxide semiconductor film are stacked.

The electrode layer 404a is to be in the base insulating layer 402b formed later; thus, a coverage defect of the electrode layer 404a does not occur even when the thickness of the electrode layer 404a is increased.

Figure 2B:
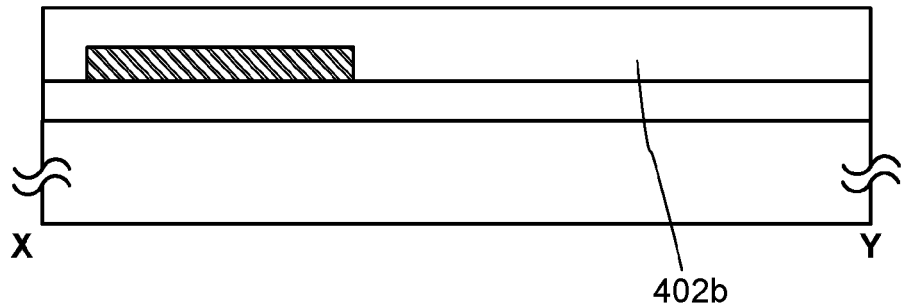

Next, the base insulating layer 402b is formed over the base insulating layer 402a and the electrode layer 404a (see FIG. 2B).

The base insulating layer 402b is formed by a plasma CVD method or a sputtering method with the use of one of an aluminum oxide film, a silicon nitride film, a silicon oxynitride film, an aluminum oxynitride film, and a silicon nitride oxide film or a stack of any of these films. In the case of a stacked-layer structure, for example, it is possible to use a silicon oxide film formed by a plasma CVD method as the base insulating layer 402a on the substrate side and a silicon oxide film formed by a sputtering method as a base insulating layer in contact with the oxide semiconductor layer 406. An oxide insulating layer in which the concentration of hydrogen is reduced is used as the insulating layer in contact with the oxide semiconductor layer 406, whereby diffusion of hydrogen in the oxide semiconductor layer 406 is suppressed, and oxygen is supplied from the oxide insulating layer to oxygen defects in the oxide semiconductor layer 406; thus, the transistor 450 can have favorable electric characteristics.

The base insulating layer 402b preferably includes a region in which the oxygen content is higher than the stoichiometric proportion. In that case, the oxygen content is higher than the stoichiometric proportion of the base insulating layer 402b. For example, in the case of using a silicon oxide film whose composition is expressed by $SiO_x$ (x>0), the stoichiometric proportion of silicon oxide is Si:O=1:2; therefore, a silicon oxide film including an oxygen-excess region, in which x is greater than 2, is preferably used. Such an oxygen-excess region may exist in part (including an interface) of the silicon oxide film.

When the base insulating layer 402b in contact with the oxide semiconductor layer 406 formed later includes a region in which the oxygen content is higher than the stoichiometric proportion, transfer of oxygen from the oxide semiconductor layer 406 to the base insulating layer 402b in contact therewith can be suppressed and oxygen can be supplied from the base insulating layer 402b in contact with the oxide semiconductor layer 406 to the oxide semiconductor layer 406.

Further, nitrogen plasma treatment may be performed on the electrode layer 404a before the base insulating layer 402b is formed. By the nitrogen plasma treatment, contact resistance between the electrode layer 404a and the oxide semiconductor layer 406 formed later can be reduced.

Figure 2C:
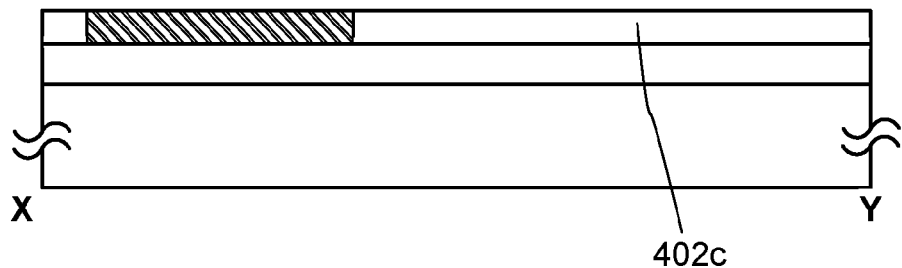

Next, the upper surface of the electrode layer 404a is exposed, and the base insulating layer 402c is formed (see FIG. 2C). Although not particularly limited, etching or polishing (e.g., chemical mechanical polishing (CMP)) can be used in order to expose the upper surface of the electrode layer 404a.

Figure 2D:
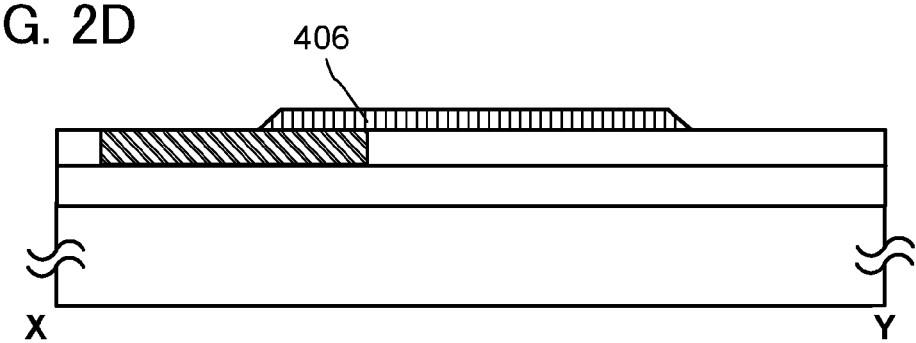

Next, the oxide semiconductor layer 406 is formed over the base insulating layer 402c and the electrode layer 404a (see FIG. 2D). As an oxide semiconductor for forming the oxide semiconductor layer 406, a highly purified oxide semiconductor obtained by removing impurities so that impurities which are carrier donors besides main components do not exist in the oxide semiconductor as much as possible, is used.

The oxide semiconductor layer 406 may be either single crystal or non-single-crystal. In the latter case, the oxide semiconductor layer may be either amorphous or polycrystal. Further, the oxide semiconductor layer may have either an amorphous structure including a portion having crystallinity or a non-amorphous structure.

It is relatively easy to make a surface of an amorphous oxide semiconductor layer flat. Thus, when a transistor is manufactured with the use of the oxide semiconductor layer, interface scattering can be reduced, and relatively high mobility can be obtained relatively easily.

In an oxide semiconductor layer having crystallinity (a crystalline oxide semiconductor layer), defects in the bulk can be further reduced, and mobility higher than that of an amorphous oxide semiconductor layer can be obtained when a surface flatness is improved. In order to improve the surface flatness, the oxide semiconductor layer is preferably formed on a flat surface. Specifically, the oxide semiconductor layer is preferably formed on a surface with an average surface roughness ($R_a$) of less than or equal to 1 nm, preferably less than or equal to 0.3 nm, more preferably less than or equal to 0.1 nm. Note that the average surface roughness ($R_a$) is preferably close to 0.

The crystal state in the crystalline oxide semiconductor layer may be a state in which directions of crystal axes are disordered or a state in which directions of crystal axes are oriented in a certain direction.

As the oxide semiconductor layer, a c-axis aligned crystalline oxide semiconductor (CAAC-OS) film can be used.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-ssectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by deposition or by performing treatment for crystallization such as heat treatment after deposition.

With the use of the CAAC-OS film in a transistor, change in electric characteristics of the transistor due to irradiation with visible light or ultraviolet light is small. Thus, the transistor has high reliability.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol. % or higher, preferably 100 vol. %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

The oxide semiconductor layer 406 can have a thickness greater than or equal to 1 nm and less than or equal to 100 nm and can be formed by a sputtering method, a molecular beam epitaxy (MBE) method, a pulsed laser deposition method, an atomic layer deposition (ALD) method, or the like as appropriate. The oxide semiconductor layer 406 may be formed using a sputtering apparatus which performs deposition with surfaces of a plurality of substrates set substantially perpendicular to a surface of a sputtering target.

In addition, since the electrode layer 404a whose thickness is larger than that of the oxide semiconductor layer 406 is under and in contact with the oxide semiconductor layer 406, electrical connection between the wiring layer and the oxide semiconductor layer can be ensured even when the oxide semiconductor layer 406 has a small thickness; thus, a transistor which can be miniaturized and operate at high speed can be provided. Since the thickness of the channel formation region in the oxide semiconductor layer is small, the threshold voltage can be positively shifted to make a normally-off transistor.

It is preferable that impurities such as hydrogen, moisture, a hydroxyl group, or hydride in a deposition chamber be removed by heating and evacuation of the deposition chamber before deposition of the oxide semiconductor. It is particularly important to remove such impurities adsorbed on an inner wall of the deposition chamber. Here, the heat treatment may be performed at a temperature higher than or equal to 100° C. and lower than or equal to 450° C., for example. Evacuation of the deposition chamber is preferably performed with a rough vacuum pump such as a dry pump, and a high vacuum pump such as a sputter ion pump, a turbo molecular pump, or a cryopump, in appropriate combination. The turbo molecular pump has an outstanding capability in evacuating a large-sized molecule, whereas it has a low capability in evacuating hydrogen or moisture. Further, combination with a cryopump having a high capability in evacuating moisture or a sputter ion pump having a high capability in evacuating hydrogen is effective. At this time, when the impurities are removed while an inert gas is introduced, the rate of desorption of moisture or the like, which is difficult to desorb only by evacuation, can be further increased. Removal of impurities in the deposition chamber by such treatment before the deposition of the oxide semiconductor can prevent hydrogen, moisture, a hydroxyl group, hydride, or the like from entering the oxide semiconductor layer 406.

An oxide semiconductor to be used preferably contains at least indium (In) or zinc (Zn). In particular, In and Zn are preferably contained. As a stabilizer for reducing variation in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. Titanium (Ti) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, a single-component metal oxide such as indium oxide, tin oxide, or zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an In—Ga—Zn-based oxide means an oxide containing In, Ga, and Zn as its main components, and there is no limitation on the ratio of In:Ga:Zn. Further, the In—Ga—Zn-based oxide may contain a metal element other than In, Ga, and Zn.

Alternatively, a material represented by $InMO_3(ZnO)_m$ (m>0, m is not an integer) may be used as the oxide semiconductor. Note that M represents one or more metal elements selected from Ga, Fe, Mn, and Co. Alternatively, as the oxide semiconductor, a material represented by $In_2SnO_5(ZnO)_n$ (n>0, n is an integer) may be used.

For example, an In—Ga—Zn-based oxide with an atomic ratio of In:Ga:Zn=1:1:1, In:Ga:Zn=3:1:2, In:Ga:Zn=1:3:2, or In:Ga:Zn=2:2:1, or any of oxides whose composition is in the neighborhood of the above can be used. Alternatively, an In—Sn—Zn-based oxide with an atomic ratio of In:Sn:Zn=1:1:1, In:Sn:Zn=2:1:3, or In:Sn:Zn=2:1:5, or any of oxides whose composition is in the neighborhood of the above may be used. Alternatively, any of these oxides may be stacked.

However, the composition is not limited to those described above, and a material having an appropriate composition may be used depending on needed semiconductor characteristics (such as mobility, threshold voltage, and variation). In order to obtain needed semiconductor characteristics, it is preferable that the carrier concentration, the impurity concentration, the defect density, the atomic ratio of a metal element to oxygen, the interatomic distance, the density, and the like be set to appropriate values.

For example, it is relatively easy to obtain high mobility with an In—Sn—Zn-based oxide. However, mobility can be increased by reducing the defect density in a bulk also in the case of using an In—Ga—Zn-based oxide.

Note that for example, the expression "the composition of an oxide containing In, Ga, and Zn at an atomic ratio, In:Ga:Zn=a:b:c (a+b+c=1), is in the neighborhood of the composition of an oxide containing In, Ga, and Zn at an atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

In the case where an In—Ga—Zn-based oxide is used for the oxide semiconductor, a target having a composition ratio of $In_2O_3:Ga_2O_3:ZnO=1:x:y$ [molar ratio] (x is greater than or equal to 0, y is greater than or equal to 0.5 and less than or equal to 5) is preferably used. For example, a target having a composition ratio of $In_2O_3:Ga_2O_3:ZnO=1:1:2$ [molar ratio], or the like can be used. It is also possible to use a target with a composition ratio of $In_2O_3:Ga_2O_3:ZnO=1:1:1$ [molar ratio] or a target with a composition ratio of $In_2O_3:Ga_2O_3:ZnO=1:1:4$ [molar ratio].

In the case where an In—Sn—Zn-based oxide is used for the oxide semiconductor, an atomic ratio of metal elements in a target to be used may be In:Sn:Zn=1:2:2, In:Sn:Zn=2:1:3, In:Sn:Zn=1:1:1, In:Sn:Zn=20:45:35, or the like.

In the case where an In—Zn-based oxide is used for the oxide semiconductor, an atomic ratio of metal elements in a target to be used is In:Zn=50:1 to 1:2 ($In_2O_3:ZnO$=25:1 to 1:4 in a molar ratio), preferably In:Zn=20:1 to 1:1 ($In_2O_3:ZnO$=10:1 to 1:2 in a molar ratio), further preferably In:Zn=15:1 to 1.5:1 ($In_2O_3:ZnO$=15:2 to 3:4 in a molar ratio). For example, in a target used for formation of an In—Zn-based oxide which has an atomic ratio of In:Zn:O=X:Y:Z, the relation of Z>1.5X+Y is satisfied.

Note that it is preferable that the oxide semiconductor layer 406 be formed under a condition that much oxygen is contained during deposition (e.g., deposited by a sputtering method in an atmosphere where the proportion of oxygen is 100%), so that a film containing much oxygen (preferably including a region where the oxygen content is higher than the stoichiometric composition of the oxide semiconductor in a crystalline state) is formed.

The deposition atmosphere may be a rare gas (typically argon) atmosphere, an oxygen atmosphere, or a mixed atmosphere containing a rare gas and oxygen. Here, when the volume of oxygen is larger than the volume of a rare gas at the time of the deposition, supply of oxygen into the oxide semiconductor layer 406 can be facilitated and oxygen vacancies in the oxide semiconductor layer 406 can be reduced. In order to prevent hydrogen, moisture, a hydroxyl group, hydride, or the like from entering the oxide semiconductor layer 406, an atmosphere of a high-purity gas from which impurities such as hydrogen, moisture, a hydroxyl group, or hydride are sufficiently removed is preferable.

After the deposition of the oxide semiconductor layer 406, heat treatment may be performed on the oxide semiconductor layer 406 in order to remove excess hydrogen (including moisture and a hydroxyl group) (to perform dehydration or dehydrogenation). The heat treatment can further remove hydrogen atoms or substances including hydrogen atoms in the oxide semiconductor layer 406. The heat treatment is performed in an inert gas atmosphere at higher than or equal to 250° C. and lower than or equal to 700° C., preferably higher than or equal to 450° C. and lower than or equal to 600° C. or lower than the strain point of the substrate. The inert gas atmosphere is preferably an atmosphere which contains nitrogen or a rare gas (e.g., helium, neon, or argon) as its main component and does not contain moisture, hydrogen, or the like. For example, the purity of nitrogen or a rare gas such as helium, neon, or argon introduced into a heat treatment apparatus is higher than or equal to 6N (99.9999%), preferably higher than or equal to 7N (99.99999%) (that is, the concentration of the impurities is lower than or equal to 1 ppm, preferably lower than or equal to 0.1 ppm).

For example, after the substrate is introduced into an electric furnace including a resistance heating element or the like, the heat treatment can be performed at 450° C. in a nitrogen atmosphere for one hour.

The heat treatment apparatus is not limited to the electric furnace and may be an apparatus for heating an object to be processed by thermal conduction or thermal radiation from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas like argon, is used. Note that in the case where a GRTA apparatus is used as the heat treatment apparatus, the substrate may be heated in an inert gas heated to a high temperature of 650° C. to 700° C. because the heat treatment time is short.

After the above heat treatment is performed on the oxide semiconductor layer 406, heat treatment for supply of oxygen (supplying oxygen to an oxide semiconductor layer; the same can be applied to the description hereinafter) may be performed in the same furnace. The heat treatment may be performed at a temperature higher than or equal to 200° C. and lower than the strain point of the substrate in a heat treatment apparatus to which a high-purity oxygen gas, a high-purity $N_2O$ gas, or ultra dry air (with a moisture content of 20 ppm (−55° C. by conversion into a dew point) or less, preferably 1 ppm or less, further preferably 10 ppb or less, in the case where measurement is performed with the use of a dew point meter of a cavity ring down laser spectroscopy (CRDS) system) is introduced. The heat treatment is performed preferably at a temperature higher than or equal to 250° C. and lower than or equal to 450° C. It is particularly preferable that moisture, hydrogen, or the like be not contained in these gases. The purity of the oxygen gas or an $N_2O$ gas that is introduced into the same furnace is preferably greater than or equal to 6N, further preferably greater than or equal to 7N (i.e., the impurity concentration is less than or equal to 1 ppm, preferably less than or equal to 0.1 ppm). By the action of the oxygen gas or the $N_2O$ gas, oxygen that is a main component of the oxide semiconductor and that has been reduced through the steps for removing impurities by dehydration or dehydrogenation treatment can be supplied.

Note that the above heat treatment has an advantageous effect for compensating an oxygen vacancy generated in the oxide semiconductor by dehydration treatment or dehydrogenation treatment; thus, the heat treatment can also be referred to as oxygen supplying treatment or the like. The heat treatment can be performed at the timing, for example, after the oxide semiconductor layer is processed into an island shape. Such oxygen supplying treatment may be performed once or plural times.

When the heat treatment for dehydration or dehydrogenation is performed in the state where the base insulating layer 402c is covered with the layer-like oxide semiconductor layer which has not been processed into the island-shaped oxide semiconductor layer 406, oxygen contained in the base insulating layer 402c can be prevented from being released by the heat treatment, which is preferable.

When the oxide semiconductor layer is processed into the island-shaped oxide semiconductor layer 406, the oxide semiconductor layer 406 is provided to be in contact with the base insulating layer 402c and at least part of the electrode layer 404a.

Further or alternatively, oxygen (which includes at least one of an oxygen radical, an oxygen atom, and an oxygen ion) may be introduced into the oxide semiconductor layer that has been subjected to the dehydration or dehydrogenation treatment in order to supply oxygen to the oxide semiconductor layer.

Introduction (supply) of oxygen to the dehydrated or dehydrogenated oxide semiconductor layer 406 enables the oxide semiconductor layer 406 to be highly purified and to be electrically i-type (intrinsic). Variation in electric characteristics of a transistor having the highly-purified and electrically i-type (intrinsic) oxide semiconductor layer 406 is suppressed, and the transistor is electrically stable.

As a method for introducing oxygen, an ion implantation method, an ion doping method, a plasma immersion ion implantation method, plasma treatment, or the like can be used.

In the step of introducing oxygen into the oxide semiconductor layer 406, oxygen may be directly introduced into the oxide semiconductor layer 406 or introduced into the oxide semiconductor layer 406 through another film such as the gate insulating layer 408 or the insulating layer 412. An ion implantation method, an ion doping method, a plasma immersion ion implantation method, or the like may be employed for the introduction of oxygen through another film, whereas plasma treatment or the like can also be employed for the introduction of oxygen directly into the exposed oxide semiconductor layer 406.

The introduction of oxygen into the oxide semiconductor layer 406 can be performed anytime after dehydration or dehydrogenation treatment is performed thereon. Further, oxygen may be introduced a plurality of times into the dehydrated or dehydrogenated oxide semiconductor layer 406.

Figure 3A:
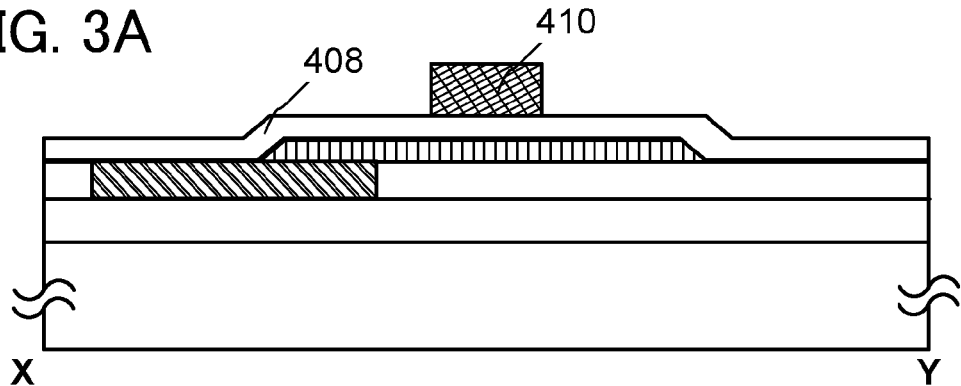
FIGS. 3A to 3C are cross-sectional views illustrating a manufacturing process of a semiconductor device of one embodiment of the present invention.

Next, the gate insulating layer 408 is formed over the base insulating layer 402c, the electrode layer 404a, and the oxide semiconductor layer 406, and the gate electrode layer 410 is formed over the gate insulating layer 408 (see FIG. 3A).

The gate insulating layer 408 can be formed to have a thickness greater than or equal to 1 nm and less than or equal to 50 nm by a sputtering method, an MBE method, a CVD method, a pulsed laser deposition method, an ALD method, or the like as appropriate. Note that in consideration of contact with the oxide semiconductor layer 406, it is preferable that impurities such as hydrogen be sufficiently removed. Accordingly, it is preferable that the gate insulating layer 408 be formed by a sputtering method by which impurities such as hydrogen are less likely to be contained.

The gate insulating layer 408 can be formed using a silicon oxide film, a gallium oxide film, an aluminum oxide film, a silicon nitride film, a silicon oxynitride film, an aluminum oxynitride film, a silicon nitride oxide film, or the like. Further, the gate insulating layer 408 is preferably formed in consideration of the size of a transistor to be manufactured and the step coverage with the gate insulating layer 408.

The gate insulating layer 408 preferably includes a region in which the oxygen content is higher than the stoichiometric proportion. In that case, the oxygen content is higher than the stoichiometric proportion of the gate insulating layer 408. For example, in the case of using a silicon oxide film whose composition is expressed by $SiO_x$ (x>0), the stoichiometric proportion of silicon oxide is Si:O=1:2; therefore, a silicon oxide film including an oxygen-excess region, in which x is greater than 2, is preferably used. Such an oxygen-excess region may exist in part (including an interface) of the silicon oxide film.

When the gate insulating layer 408 in contact with the oxide semiconductor layer 406 includes a region in which the oxygen content is higher than the stoichiometric proportion, transfer of oxygen from the oxide semiconductor layer 406 to the gate insulating layer 408 in contact therewith can be suppressed and oxygen can be supplied from the gate insulating layer 408 in contact with the oxide semiconductor layer 406 to the oxide semiconductor layer 406.

When the gate insulating layer 408 is formed using a high-k material such as hafnium oxide, yttrium oxide, lanthanum oxide, hafnium silicate ($HfSi_xO_y$ (x>0, y>0)), hafnium aluminate ($HfAl_xO_y$ (x>0, y>0)), hafnium silicate to which nitrogen is added, or hafnium aluminate to which nitrogen is added, gate leakage current can be reduced. Further, the gate insulating layer 408 may have a single-layer structure or a stacked structure.

Heat treatment for supply of oxygen may be performed after the formation of the gate insulating layer 408. The heat treatment is preferably performed in an inert gas atmosphere or an oxygen atmosphere at a temperature higher than or equal to 200° C. and lower than or equal to 450° C., further preferably higher than or equal to 250° C. and lower than or equal to 350° C. By performing the heat treatment, variation in electric characteristics of the transistor can be reduced. In the case where the gate insulating layer 408 in contact with the oxide semiconductor layer 406 includes oxygen, oxygen can be supplied to the oxide semiconductor layer 406 to fill an oxygen vacancy in the oxide semiconductor layer 406.

By the heat treatment for dehydration or dehydrogenation and the heat treatment for supply of oxygen, an i-type (intrinsic) or substantially i-type oxide semiconductor layer can be formed.

Note that in this embodiment, the heat treatment for supply of oxygen is performed after the gate insulating layer 408 is formed; however, the timing of the heat treatment is not limited thereto. For example, the heat treatment may be performed after the gate electrode layer 410 is formed. The heat treatment for supply of oxygen may also serve as the heat treatment for dehydration or dehydrogenation.

The gate electrode layer 410 is not overlapped with the electrode layer 404a and is formed over the oxide semiconductor layer 406 with the gate insulating layer 408 provided therebetween.

The gate electrode layer 410 can be formed using a metal material such as molybdenum, titanium, tantalum, tungsten, aluminum, copper, chromium, neodymium, or scandium, an alloy material containing any of these metal materials as its main component, a metal nitride containing any of these metal materials as its main component (titanium nitride, molybdenum nitride, or tungsten nitride), or the like. As the gate electrode layer 410, a semiconductor film typified by a polycrystalline silicon film to which an impurity element such as phosphorus is added, or a silicide film such as a nickel silicide film may be used. The gate electrode layer 410 may have a single-layer structure or a stacked structure.

Figure 3B:
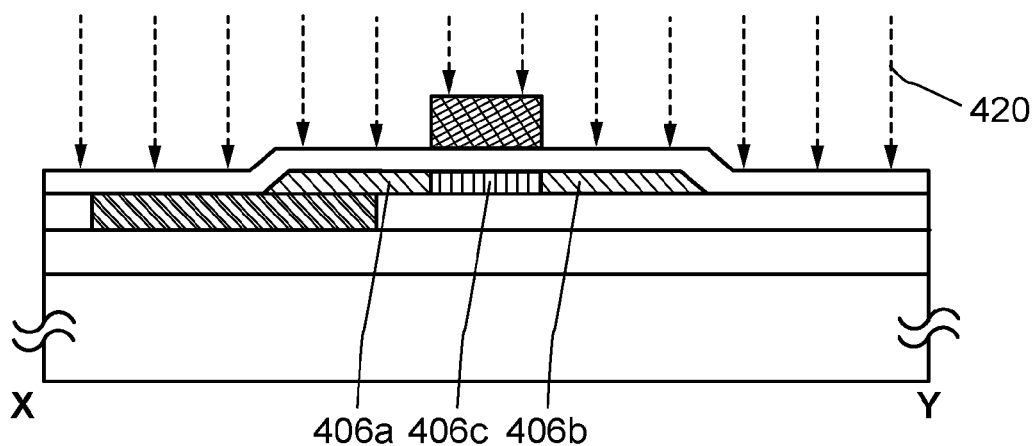

Next, treatment for adding an impurity 420 to the oxide semiconductor layer 406 is performed with the use of the gate electrode layer 410 as a mask, so that the low-resistance region 406a, the low-resistance region 406b, and the channel formation region 406c are formed in a self-aligned manner (see FIG. 3B).

As the impurity 420 to be added is phosphorus, boron, nitrogen, arsenic, argon, aluminum, a molecular ion containing any of the above elements, or the like is used.

As a method for adding the impurity 420 to the oxide semiconductor layer 406, an ion doping method or an ion implantation method can be used.

The treatment for adding the impurity 420 to the oxide semiconductor layer 406 may be performed plural times. In the case where the treatment for adding the impurity 420 to the oxide semiconductor layer 406 is performed plural times, the kind of the impurity 420 may be the same in the plural treatments or different in every treatment.

The dose of the impurity 420 is preferably $1\times10^{13}$ ions/cm$^2$ to $5\times10^{16}$ ions/cm$^2$. When phosphorus is added as the impurity, the acceleration voltage is preferably 0.5 kV to 80 kV. In this embodiment, phosphorus is added to the oxide semiconductor layer 406 as the impurity 420 by an ion implantation method under the conditions where the acceleration voltage is 30 kV and the dose is $1.0\times10^{15}$ ions/cm$^2$.

The low-resistance region 406a and the low-resistance region 406b each have a higher impurity concentration than the channel formation region 406c. When the impurity concentration is increased, the carrier density of the oxide semiconductor layer is increased and contact resistance between the wiring layer and the oxide semiconductor layer is reduced; thus, favorable ohmic contact can be obtained between the wiring layer and the oxide semiconductor layer.

In addition, by the above treatment for adding the impurity 420, the resistance of the electrode layer 404a is also reduced. Thus, contact resistance between the wiring layer 414a formed later and the electrode layer 404a is also reduced in the region whose resistance is reduced, so that favorable ohmic contact can be obtained between the wiring layer 414a and the electrode layer 404a. Further, contact resistance between the low-resistance region 406a and the electrode layer 404a is also reduced, so that favorable ohmic contact can be obtained between the low-resistance region 406a and the electrode layer 404a.

Thus, on-state current and mobility are improved, and a transistor with high-speed response can be manufactured. In the region whose resistance is reduced, ohmic contact can be obtained; thus, thermally stable operation as compared to the case of Schottky junction can be obtained.

Figure 3C:
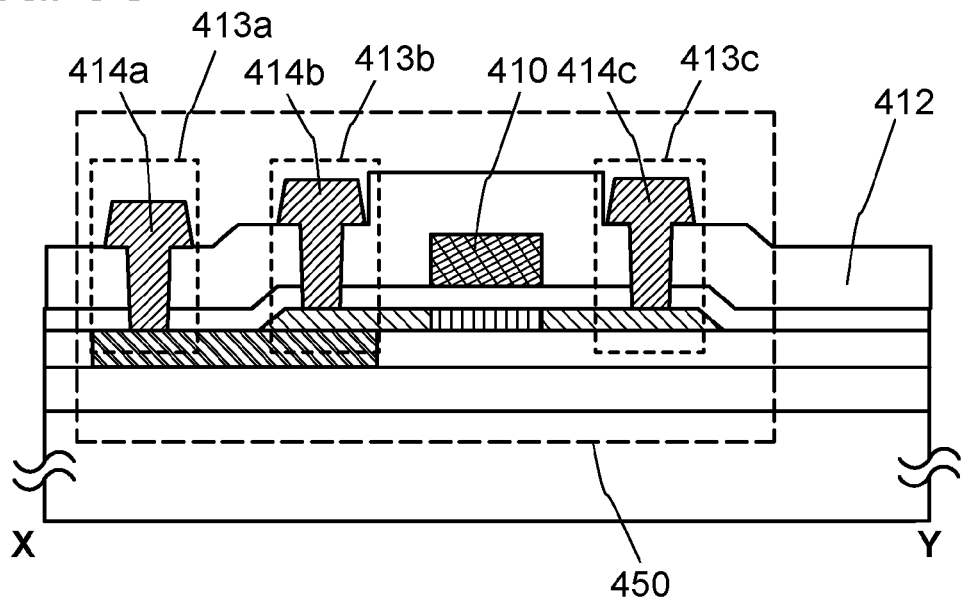

Next, the insulating layer 412 is formed over the gate insulating layer 408 and the gate electrode layer 410 (see FIG. 3C).

The insulating layer 412 can be formed by a plasma CVD method, a sputtering method, an evaporation method, or the like. As the insulating layer 412, an inorganic insulating film such as a silicon oxide film, a silicon oxynitride film, an aluminum oxynitride film, or a gallium oxide film can be typically used.

Alternatively, as the insulating layer 412, an aluminum oxide film, a hafnium oxide film, a magnesium oxide film, a zirconium oxide film, a lanthanum oxide film, a barium oxide film, or a metal nitride film (e.g., an aluminum nitride film) can be used.

The insulating layer 412 can be either a single layer or a stack. The insulating layer 412 can be a stack of a silicon oxide film and an aluminum oxide film, for example.

The insulating layer 412 is preferably formed by a method by which impurities such as water and hydrogen do not enter the insulating layer 412, such as a sputtering method, as appropriate.

In order to remove residual moisture from the deposition chamber of the insulating layer 412 in a manner similar to that of the deposition of the oxide semiconductor layer, an entrapment vacuum pump (such as a cryopump) is preferably used. When the insulating layer 412 is deposited in the deposition chamber evacuated using a cryopump, the impurity concentration of the insulating layer 412 can be reduced. As an evacuation unit for removing moisture remaining in the deposition chamber for the insulating layer 412, a turbo molecular pump provided with a cold trap may be used.

The aluminum oxide film which can be used as the insulating layer 412 provided over the oxide semiconductor layer 406 has a high shielding (blocking) effect of preventing penetration of both oxygen and impurities such as hydrogen and moisture.

Therefore, in and after the manufacturing process, the aluminum oxide film functions as a protective film for preventing entry of an impurity such as hydrogen or moisture, which causes a change, into the oxide semiconductor layer 406 and release of oxygen, which is a main component material of the oxide semiconductor, from the oxide semiconductor layer 406.

Further, a planarization insulating layer may be formed in order to reduce surface roughness due to the transistor. As the planarization insulating layer, an organic material such as polyimide, an acrylic resin, or a benzocyclobutene-based resin can be used. Other than such organic materials, it is also possible to use a low-dielectric constant material (a low-k material) or the like. Note that the planarization insulating layer may be formed by stacking a plurality of insulating films formed using these materials.

The opening 413a, the opening 413b, and the opening 413c respectively reaching the electrode layer 404a, the low-resistance region 406a, and the low-resistance region 406b are formed in the gate insulating layer 408 and the insulating layer 412. The wiring layer 414a electrically connected to the electrode layer 404a is formed in the opening 413a, the wiring layer 414b electrically connected to the low-resistance region 406a is formed in the opening 413b, and the wiring layer 414c electrically connected to the low-resistance region 406b is formed in the opening 413c (see FIG. 3C).

In this embodiment, the opening 413a, and the openings 413b and 413c are formed in different steps. First, the opening 413a is formed by selective etching using a resist mask, the resist mask is removed, and then, the openings 413b and 413c are formed by selective etching using a resist mask. After that, the resist mask is removed. Without limitation to this order, the openings 413b and 413c may be formed first.

The wiring layers 414a to 414c can be formed using a material and a formation method which are similar to those of the gate electrode layer 410. For example, as the wiring layers 414a to 414c, a stack of a tantalum nitride film and a copper film or a stack of a tantalum nitride film and a tungsten film can be used.

Even when the wiring layer overlapping with the electrode layer and the low-resistance region penetrates the low-resistance region, electrical connection is ensured by the electrode layer in contact with a lower portion of the low-resistance region. Thus, precise alignment is not needed in formation of the above openings, and a highly reliable transistor can be formed.

The wiring layers 414a and 414b may be connected to each other over the insulating layer 412 and have the same potential.

With a structure in which a plurality of wiring layers are provided on the low-resistance region 406a side when seen from the gate electrode layer 410, the degree of freedom of layout is increased; thus, the increase in the degree of integration of the semiconductor device can be achieved.

The wiring layer and the electrode layer are preferably formed using the same material because the wiring layer is connected to the electrode layer through the opening. Accordingly, contact resistance can be suppressed because the same material is in contact with each other.

As described above, favorable ohmic contact can be obtained in the region of the electrode layer, the oxide semiconductor layer, or the like whose resistance is reduced by the treatment for adding an impurity after the gate electrode layer is formed; thus, on-state current and mobility are improved, and high-speed response can be obtained. In the region whose resistance is reduced, ohmic contact can be obtained; thus, thermally stable operation as compared to the case of Schottky junction can be obtained. Even when the thickness of the electrode layer is increased, a coverage defect of the electrode layer does not occur because the electrode layer electrically connected to the oxide semiconductor layer is provided in the base insulating layer; thus, the thicknesses of the electrode layer and the wiring layer can be increased and the thickness of the oxide semiconductor layer can be reduced, and miniaturization and high speed operation of the transistor can be achieved. Even when the wiring layer overlapping with the electrode layer and the low-resistance region penetrates the low-resistance region, electrical connection is ensured by the electrode layer in contact with a lower portion of the low-resistance region; therefore, precise alignment is not needed in formation of the opening, and a highly reliable transistor can be formed. With a structure in which a plurality of wiring layers are provided on the low-resistance region 406a side when seen from the gate electrode layer 410, the degree of freedom of layout is increased, and the increase in the degree of integration of the semiconductor device can be achieved.

The structures, methods, and the like described in this embodiment can be combined as appropriate with any of the structures, methods, and the like described in the other embodiments.

Embodiment 2

In this embodiment, a semiconductor device which is another embodiment of the present invention and a method for manufacturing the semiconductor device will be described with reference to FIGS. 4A and 4B, FIGS. 5A to 5D, and FIGS. 6A to 6C. In this embodiment, a top gate transistor will be described as an example of the semiconductor device.

Figure 4A:
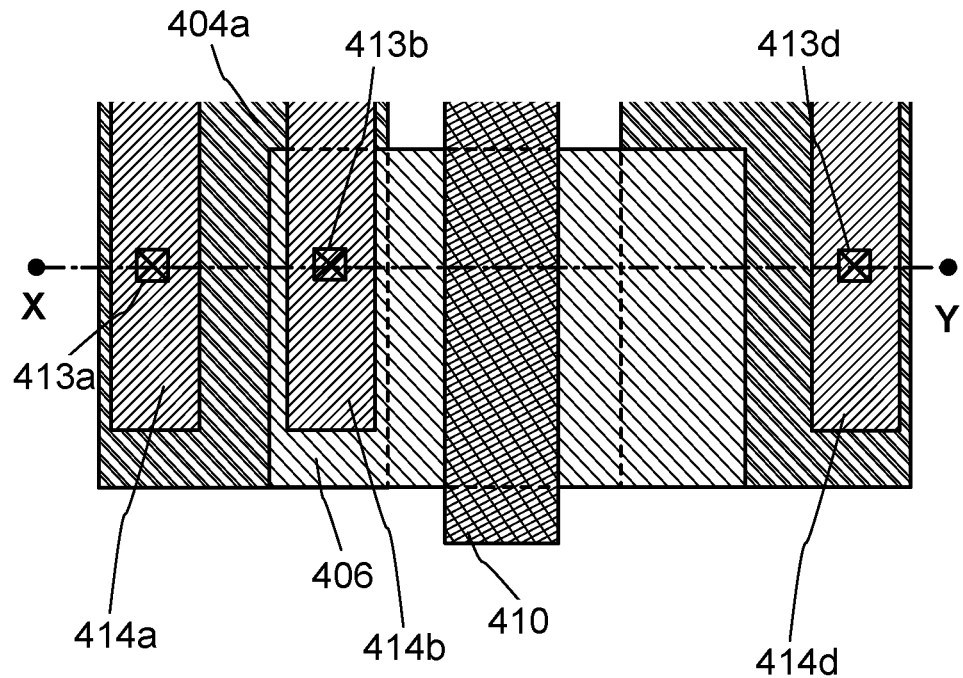
FIGS. 4A and 4B are a plan view and a cross-sectional view illustrating a semiconductor device of one embodiment of the present invention.
Figure 4B:
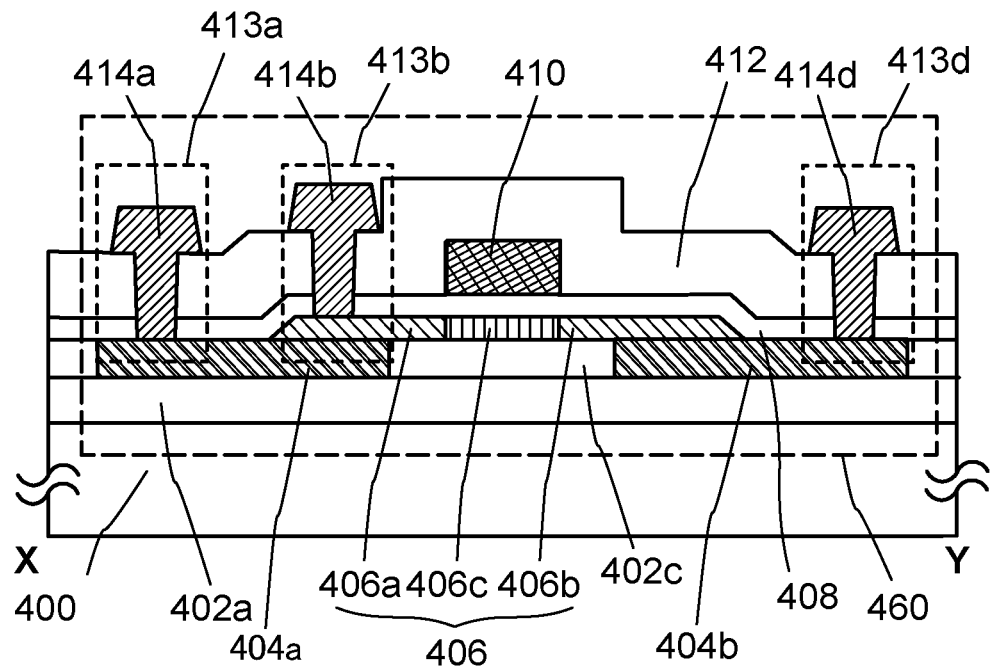

FIGS. 4A and 4B are a plan view and a cross-sectional view of a transistor 460. FIG. 4A is a plan view and FIG. 4B is a cross-sectional view taken along line X-Y in FIG. 4A. Note that in FIG. 4A, some components of the transistor 460 (e.g., an insulating layer 412) are not illustrated for simplicity.

FIGS. 4A and 4B are an example of a structure of a semiconductor device manufactured by a method of this embodiment. The transistor 460 in FIGS. 4A and 4B includes a substrate 400, a base insulating layer 402a, a base insulating layer 402c, an electrode layer 404a, an electrode layer 404b, an oxide semiconductor layer 406 including a channel formation region 406c and a low-resistance region 406a and a low-resistance region 406b between which the channel formation region 406c is sandwiched, a gate insulating layer 408, a gate electrode layer 410, the insulating layer 412, a wiring layer 414a, a wiring layer 414b, and a wiring layer 414d.

Here, this embodiment is different from the above embodiment in that there are the electrode layer 404a and the electrode layer 404b over the base insulating layer 402a and a portion where an opening 413d and the wiring layer 414d are formed is different from the portion where the opening 413c and the wiring layer 414c are formed in FIGS. 1A and 1B.

The base insulating layer is a stack of the base insulating layer 402a and the base insulating layer 402c, and the electrode layer 404a and the electrode layer 404b are provided in parts of a region over the base insulating layer 402a. Note that upper surfaces of the electrode layers 404a and 404b are in contact with at least parts of the low-resistance regions 406a and 406b, respectively, and are not in contact with the channel formation region 406c.

The low-resistance region 406a is provided in contact with the upper surface of the electrode layer 404a and an upper surface of the base insulating layer 402c, the low-resistance region 406b is provided in contact with the upper surfaces of the electrode layer 404b and the base insulating layer 402c, and the channel formation region 406c is provided in contact with the upper surface of the base insulating layer 402c. In addition, the low-resistance region 406a and the low-resistance region 406b each serve as a source region or a drain region.

An example of a manufacturing process of the transistor 460 will be described below.

Figure 5A:
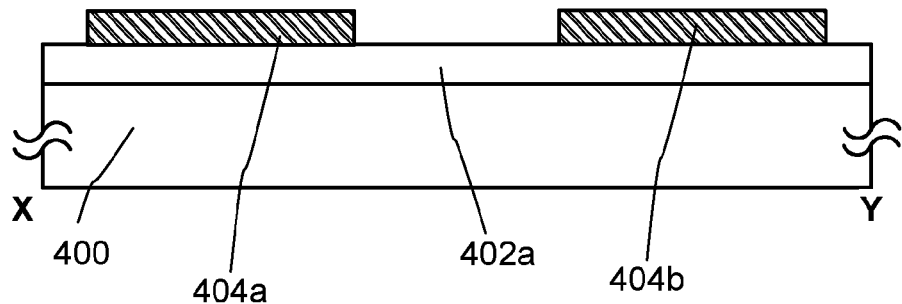
FIGS. 5A to 5D are cross-sectional views illustrating a manufacturing process of a semiconductor device of one embodiment of the present invention.

First, the base insulating layer 402a is formed over the substrate 400 having an insulating surface (see FIG. 5A).

The above embodiment can be referred to for the formation method, material, and the like of the base insulating layer 402a.

Next, after a conductive film is formed over the base insulating layer 402a, the electrode layers 404a and 404b are formed through a photolithography step and an etching step (see FIG. 5A).

The above embodiment can be referred to for the formation method, material, and the like of the electrode layers 404a and 404b.

The electrode layers 404a and 404b are to be in the base insulating layer 402b formed later; thus, coverage defects of the electrode layers 404a and 404b does not occur even when the thicknesses of the electrode layers 404a and 404b are increased.

Figure 5B:
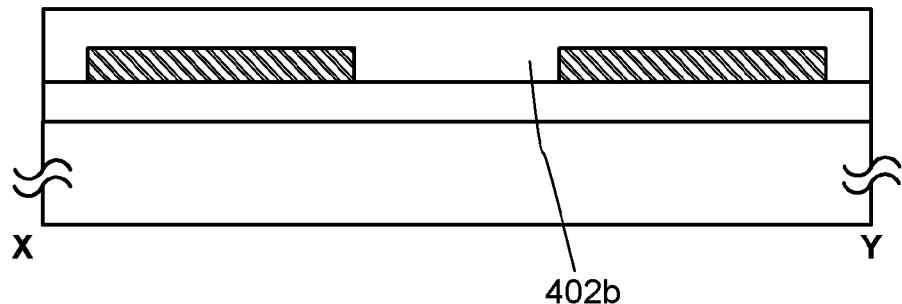

Next, the base insulating layer 402b is formed over the base insulating layer 402a, the electrode layer 404a, and the electrode layer 404b (see FIG. 5B).

Further, nitrogen plasma treatment may be performed on the electrode layers 404a and 404b before the base insulating layer 402b is formed. By the nitrogen plasma treatment, contact resistance between the electrode layers 404a and 404b and the oxide semiconductor layer 406 formed later can be reduced.

Figure 5C:
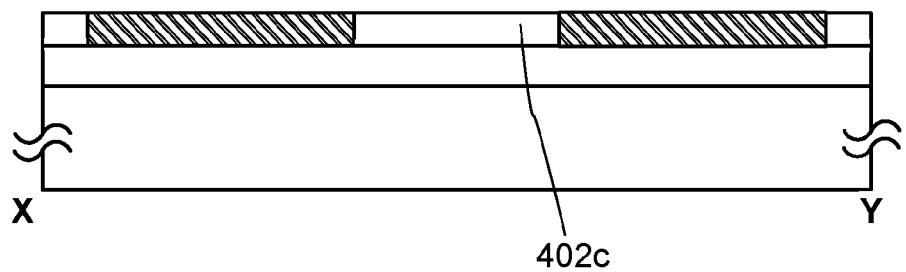

Next, the upper surfaces of the electrode layers 404a and 404b are exposed, and the base insulating layer 402c is formed (see FIG. 5C).

The above embodiment can be referred to for the material and formation method of the base insulating layer 402b and treatment for exposing the upper surfaces of the electrode layers 404a and 404b.

Figure 5D:
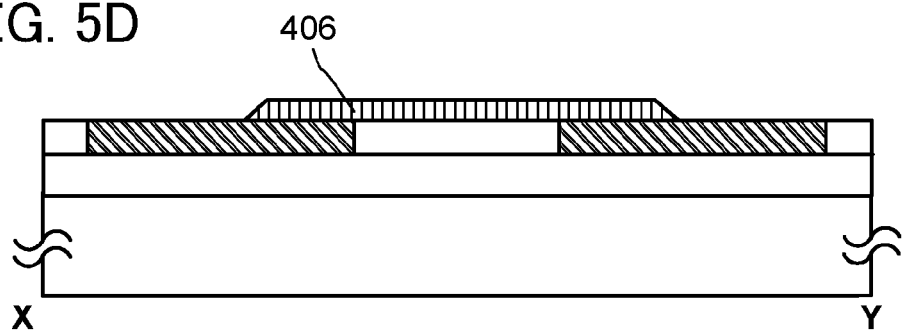

Next, the oxide semiconductor layer 406 is formed over the base insulating layer 402c and the electrode layers 404a and 404b (see FIG. 5D).

Figure 6A:
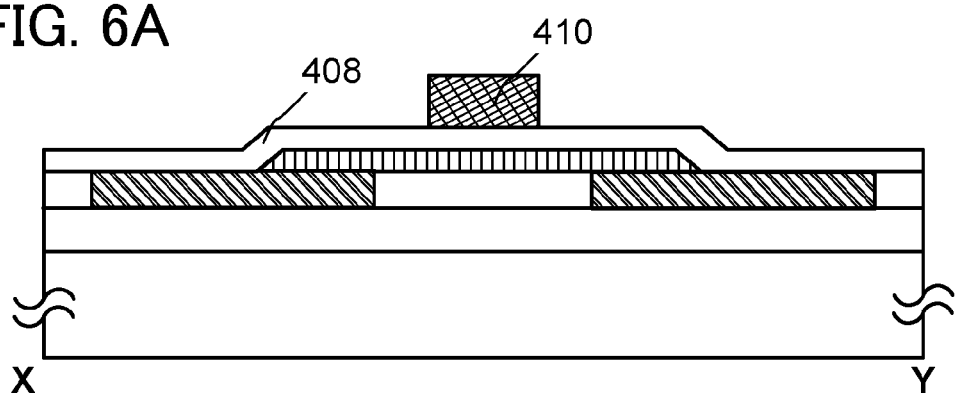
FIGS. 6A to 6C are cross-sectional views illustrating a manufacturing process of a semiconductor device of one embodiment of the present invention.

Next, the gate insulating layer 408 is formed over the base insulating layer 402c, the electrode layers 404a and 404b, and the oxide semiconductor layer 406, and the gate electrode layer 410 is formed over the gate insulating layer 408 (see FIG. 6A).

The above embodiment can be referred to for the materials and formation methods of the oxide semiconductor layer 406, the gate insulating layer 408, and the gate electrode layer 410.

Since the electrode layers 404a and 404b each of which has a thickness larger than that of the oxide semiconductor layer 406 are under and in contact with the oxide semiconductor layer 406, electrical connection between the wiring layer and the oxide semiconductor layer can be ensured even when the oxide semiconductor layer 406 has a small thickness; thus, a transistor which can be miniaturized and operate at high speed can be provided. Since the thickness of the channel formation region in the oxide semiconductor layer is small, the threshold voltage can be positively shifted to make a normally-off transistor.

When the heat treatment for dehydration or dehydrogenation is performed in the state where the base insulating layer 402c is covered with the layer-like oxide semiconductor layer which has not been processed into the island-shaped oxide semiconductor layer 406, oxygen contained in the base insulating layer 402c can be prevented from being released by the heat treatment, which is preferable.

When the oxide semiconductor layer is processed into the island-shaped oxide semiconductor layer 406, the oxide semiconductor layer 406 is provided to be in contact with the base insulating layer 402c, at least part of the electrode layer 404a, and at least part of the electrode layer 404b.

Figure 6B:
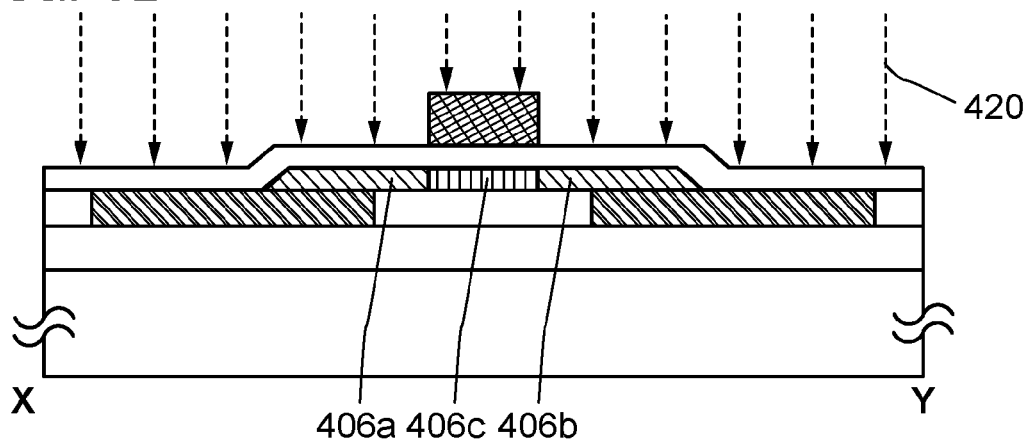

Next, treatment for adding an impurity 420 to the oxide semiconductor layer 406 is performed with the use of the gate electrode layer 410 as a mask, so that the low-resistance region 406a, the low-resistance region 406b, and the channel formation region 406c are formed in a self-aligned manner (see FIG. 6B).

The above embodiment can be referred to for the method and conditions for adding the impurity 420.

The low-resistance region 406a and the low-resistance region 406b each have a higher impurity concentration than the channel formation region 406c. When the impurity concentration is increased, the carrier density of the oxide semiconductor layer is increased and contact resistance between the wiring layer and the oxide semiconductor layer is reduced; thus, favorable ohmic contact can be obtained between the wiring layer and the oxide semiconductor layer.

In addition, by the above treatment for adding the impurity 420, the resistance of the electrode layer is also reduced. Thus, contact resistance between the wiring layer formed later and the electrode layer is also reduced in the region whose resistance is reduced, so that favorable ohmic contact can be obtained between the wiring layer and the electrode layer. Further, contact resistance between the low-resistance region and the electrode layer is also reduced, so that favorable ohmic contact can be obtained between the low-resistance region and the electrode layer.

Thus, on-state current and mobility are improved, and a transistor with high-speed response can be manufactured. In the region whose resistance is reduced, ohmic contact can be obtained; thus, thermally stable operation as compared to the case of Schottky junction can be obtained.

Figure 6C:
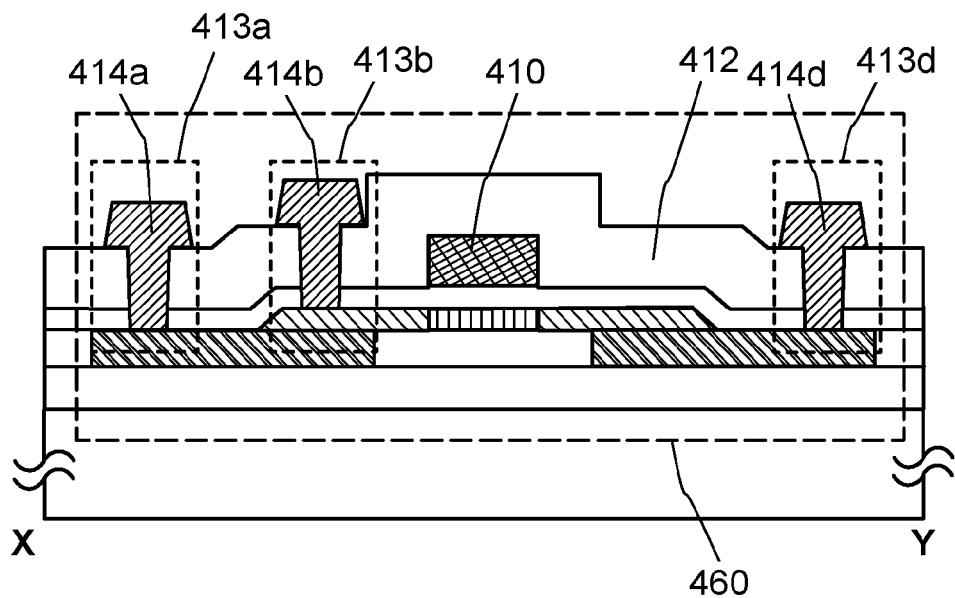

Next, the insulating layer 412 is formed over the gate insulating layer 408 and the gate electrode layer 410 (see FIG. 6C).

The above embodiment can be referred to for the material and formation method of the insulating layer 412.

An opening 413a, an opening 413b, and the opening 413d respectively reaching the electrode layer 404a, the low-resistance region 406a, and the electrode layer 404b are formed in the gate insulating layer 408 and the insulating layer 412. A wiring layer 414a electrically connected to the electrode layer 404a is formed in the opening 413a, the wiring layer 414b electrically connected to the low-resistance region 406a is formed in the opening 413b, and the wiring layer 414d electrically connected to the electrode layer 404b is formed in the opening 413d (see FIG. 6C).

In this embodiment, the openings 413a and 413d, and the opening 413b are formed in different steps. First, the openings 413a and 413d are formed by selective etching using a resist mask, the resist mask is removed, and then, the opening 413b is formed by selective etching using a resist mask. After that, the resist mask is removed. Without limitation to this order, the opening 413b may be formed first.

The wiring layers 414a, 414b, and 414d can be formed using a material and a formation method which are similar to those of the gate electrode layer 410. For example, as the wiring layers 414a, 414b, and 414d, a stack of a tantalum nitride film and a copper film or a stack of a tantalum nitride film and a tungsten film can be used.

The wiring layers 414a and 414b may be connected to each other over the insulating layer 412 and have the same potential.

With a structure in which a plurality of wiring layers are provided on the low-resistance region 406a side when seen from the gate electrode layer 410, the degree of freedom of layout is increased; thus, the increase in the degree of integration of the semiconductor device can be achieved.

The wiring layer and the electrode layer are preferably formed using the same material because the wiring layer is connected to the electrode layer through the opening. Accordingly, contact resistance can be suppressed because the same material is in contact with each other.

As described above, favorable ohmic contact can be obtained in the region of the electrode layer, the oxide semiconductor layer, or the like whose resistance is reduced by the treatment for adding an impurity after the gate electrode layer is formed; thus, on-state current and mobility are improved, and high-speed response can be obtained. In the region whose resistance is reduced, ohmic contact can be obtained; thus, thermally stable operation as compared to the case of Schottky junction can be obtained. Even when the thickness of the electrode layer is increased, a coverage defect of the electrode layer does not occur because the electrode layer electrically connected to the oxide semiconductor layer is provided in the base insulating layer; thus, the thicknesses of the electrode layer and the wiring layer can be increased and the thickness of the oxide semiconductor layer can be reduced, and miniaturization and high speed operation of the transistor can be achieved. Even when the wiring layer overlapping with the electrode layer and the low-resistance region penetrates the low-resistance region, electrical connection is ensured by the electrode layer in contact with a lower portion of the low-resistance region; therefore, precise alignment is not needed in formation of the opening, and a highly reliable transistor can be formed. With a structure in which a plurality of wiring layers are provided on the low-resistance region 406a side when seen from the gate electrode layer 410, the degree of freedom of layout is increased, and the increase in the degree of integration of the semiconductor device can be achieved.

FIGS. 7A to 7D each show an example of a structure of a transistor different from the transistors in FIGS. 1A and 1B and FIGS. 4A and 4B.

Figure 7A:
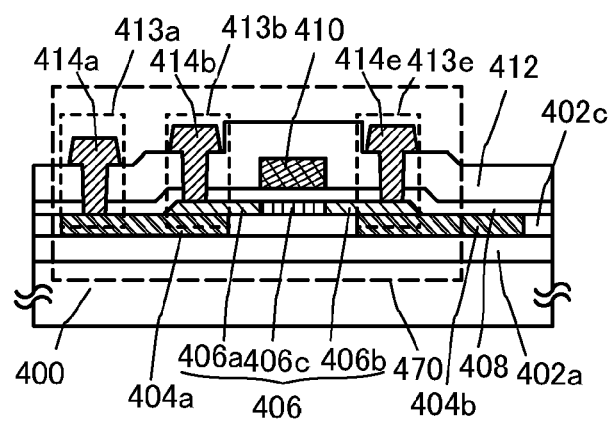
FIGS. 7A to 7D are cross-sectional views each illustrating a semiconductor device of one embodiment of the present invention.

A transistor 470 in FIG. 7A is different from the transistor 450 in that the electrode layer 404b is provided in contact with the low-resistance region 406b over the base insulating layer 402a. A wiring layer 414e is provided in an opening 413e formed in the gate insulating layer 408 and the insulating layer 412.

Figure 7B:
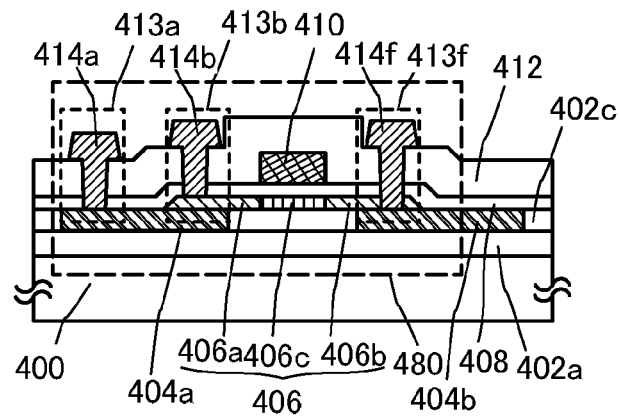

A transistor 480 in FIG. 7B is different from the transistor 470 in FIG. 7A in that a wiring layer 414f is provided in an opening 413f reaching the electrode layer 404b.

Figure 7C:
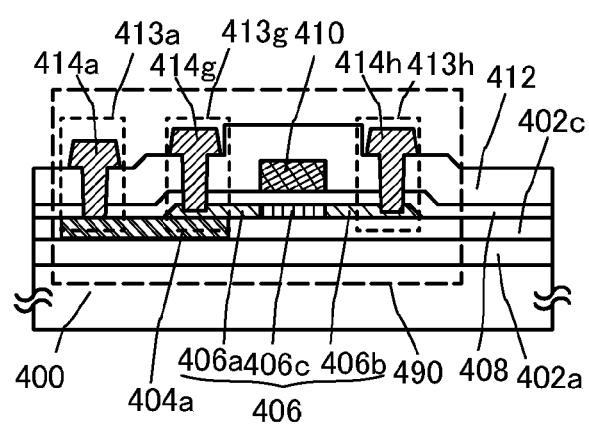

A transistor 490 in FIG. 7C is different from the transistor 450 in that a wiring layer 414g is provided in an opening 413g reaching the inside of the low-resistance region 406a and a wiring layer 414h is provided in an opening 413h reaching the inside of the low-resistance region 406b.

Figure 7D:
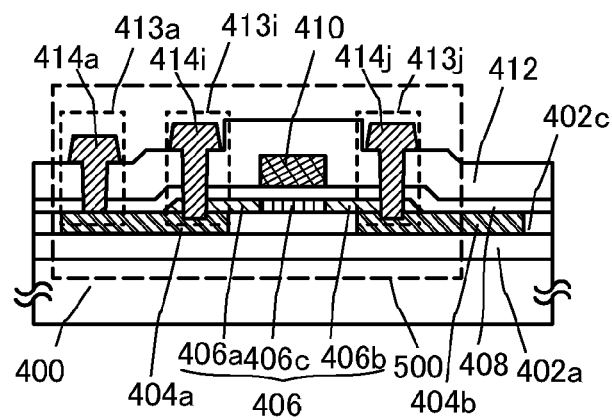

A transistor 500 in FIG. 7D is different from the transistor 470 in FIG. 7A in that a wiring layer 414i is provided in an opening 413i reaching the inside of the electrode layer 404a and a wiring layer 414j is provided in an opening 413j reaching the inside of the electrode layer 404b.

The structures, methods, and the like described in this embodiment can be combined as appropriate with any of the structures, methods, and the like described in the other embodiments.

Embodiment 3

In this embodiment, an example of a semiconductor device which includes the transistor described in Embodiment 1 or 2, which can hold stored data even when not powered, and which does not have a limitation on the number of write cycles, will be described with reference to drawings. Note that a transistor 162 included in the semiconductor device in this embodiment is the transistor described in Embodiment 1 or 2. Any of the structures of the transistors described in Embodiment 1 or 2 can be employed for the transistor 162.

Since the off-state current of the transistor 162 is small, stored data can be held for a long time owing to such a transistor. In other words, power consumption can be sufficiently reduced because a semiconductor storage device in which refresh operation is unnecessary or the frequency of refresh operation is extremely low can be provided.

Figure 8A:
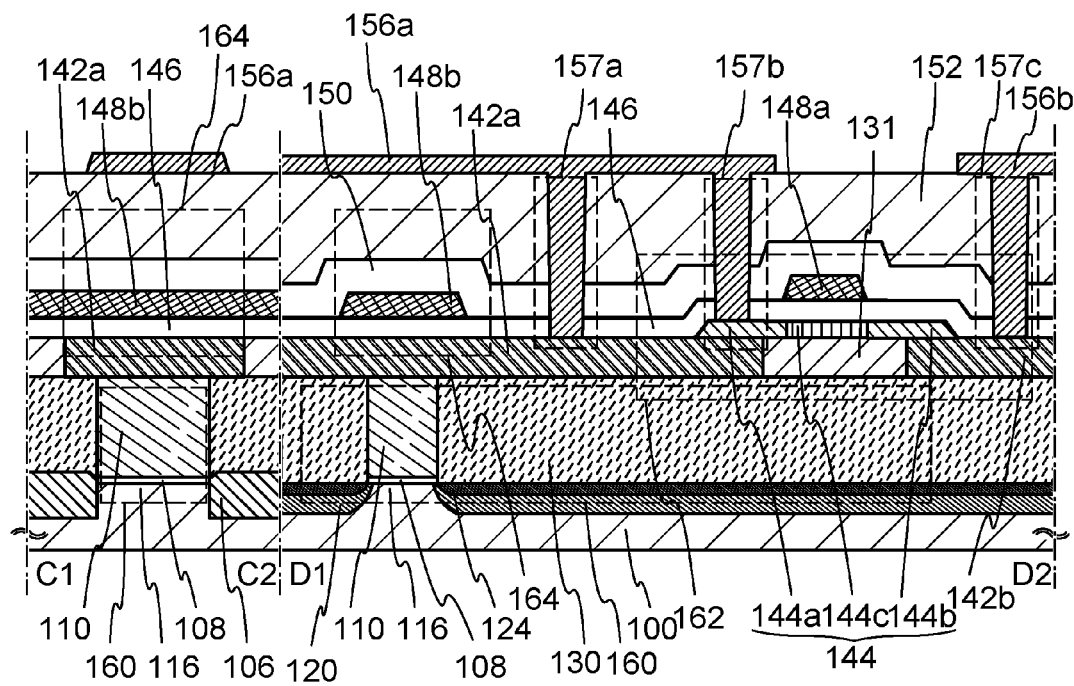
FIGS. 8A to 8C are a cross-sectional view, a plan view, and a circuit diagram illustrating one embodiment of a semiconductor device.
Figure 8B:
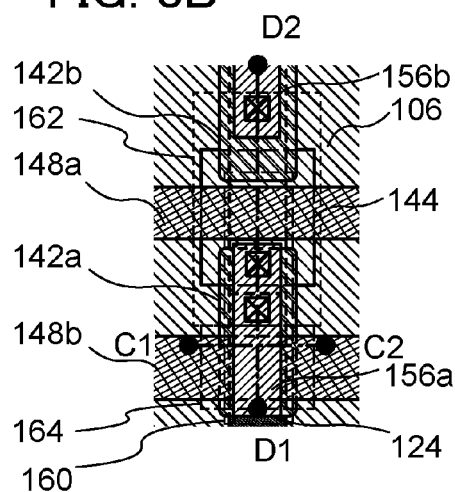
Figure 8C:
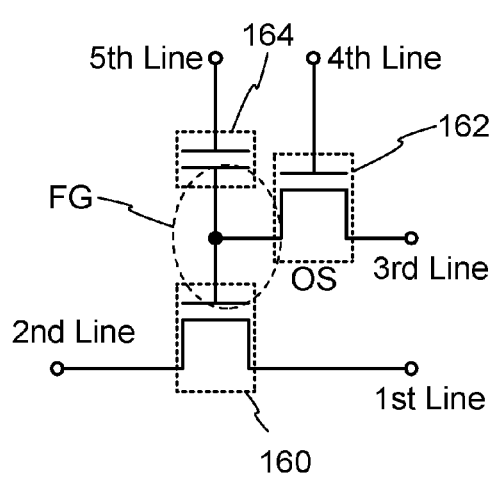

FIGS. 8A to 8C illustrate an example of a structure of a semiconductor device. FIG. 8A is a cross-sectional view of the semiconductor device, FIG. 8B is a plan view of the semiconductor device, and FIG. 8C is a circuit diagram of the semiconductor device. Here, FIG. 8A corresponds to a cross section along line C1-C2 and line D1-D2 in FIG. 8B.

The semiconductor device illustrated in FIGS. 8A and 8B includes a transistor 160 including a first semiconductor material in a lower portion, and the transistor 162 including a second semiconductor material in an upper portion. The transistor 162 can have the same structure as that described in Embodiment 1 or 2.

Here, the first semiconductor material and the second semiconductor material are preferably materials having different band gaps. For example, the first semiconductor material can be a semiconductor material other than an oxide semiconductor (e.g., silicon) and the second semiconductor material can be an oxide semiconductor. A transistor including a material other than an oxide semiconductor can operate at high speed easily. On the other hand, a transistor including an oxide semiconductor enables holding of charge for a long time owing to its characteristics.

Although all the transistors are n-channel transistors here, p-channel transistors can be used. The technical nature of this embodiment of the disclosed invention is to use an oxide semiconductor in the transistor 162 so that data can be held. Therefore, it is not necessary to limit a specific structure of the semiconductor device, such as a material of the semiconductor device or a structure of the semiconductor device, to the structure described here.

The transistor 160 in FIG. 8A includes a channel formation region 116 provided over a substrate 100 including a semiconductor material (e.g., silicon), impurity regions 120 with the channel formation region 116 provided therebetween, intermetallic compound regions 124 in contact with the impurity regions 120, a gate insulating layer 108 provided over the channel formation region 116, and a gate electrode layer 110 provided over the gate insulating layer 108. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode", and a drain region and a drain electrode are collectively referred to as a "drain electrode". That is, in this specification, the term "source electrode" may include a source region.

An element isolation insulating layer 106 is provided over the substrate 100 to surround the transistor 160, and an insulating layer 130 is provided to cover the transistor 160. Further, an insulating layer 131 is provided over the insulating layer 130. Note that in order to realize high integration, it is preferable that, as in FIG. 8A, the transistor 160 do not have a sidewall insulating layer. On the other hand, when the characteristics of the transistor 160 have priority, the sidewall insulating layer may be formed on a side surface of the gate electrode layer 110 and the impurity regions 120 may include a region having a different impurity concentration.

The transistor 162 in FIG. 8A includes an oxide semiconductor in the channel formation region. Here, an oxide semiconductor layer 144 included in the transistor 162 is preferably highly purified. By using a highly purified oxide semiconductor, the transistor 162 can have extremely favorable off-state current characteristics.

Treatment for adding an impurity is performed on the oxide semiconductor layer 144. The treatment for adding an impurity is performed on the oxide semiconductor layer with the use of the gate electrode layer as a mask, so that the low-resistance region 144a, the low-resistance region 144b, and the channel formation region 144c are formed in the oxide semiconductor layer in a self-aligned manner.

The low-resistance region 144a and the low-resistance region 144b each have a higher impurity concentration than the channel formation region 144c. When the impurity concentration is increased, the carrier density of the oxide semiconductor layer is increased and contact resistance between the wiring layer and the oxide semiconductor layer is reduced; thus, favorable ohmic contact can be obtained between the wiring layer and the oxide semiconductor layer. Thus, on-state current and mobility are improved, and high-speed response can be obtained. In the region whose resistance is reduced, ohmic contact can be obtained; thus, thermally stable operation as compared to the case of Schottky junction can be obtained.

An insulating layer 150 having a single layer or a stack is provided over the transistor 162. In addition, a conductive layer 148b is provided in a region overlapping with an electrode layer 142a of the transistor 162 with the gate insulating layer 146 provided therebetween, and the electrode layer 142a, the gate insulating layer 146, and the conductive layer 148b form a capacitor 164. That is, the electrode layer 142a of the transistor 162 functions as one electrode of the capacitor 164, and the conductive layer 148b functions as the other electrode of the capacitor 164. Note that the capacitor 164 can be omitted if a capacitor is not needed. Alternatively, the capacitor 164 may be separately provided above the transistor 162.

The insulating layer 150 and an insulating layer 152 are provided over the transistor 162 and the capacitor 164. A wiring layer 156a and a wiring layer 156b for connecting the electrode layer 142a, the low-resistance region 144a, and the electrode layer 142b are provided over the insulating layer 152. The wiring layer 156a is electrically connected to the electrode layer 142a, the low-resistance region 144a, and the electrode layer 142b through an opening 157a and an opening 157b formed in the insulating layer 150, the insulating layer 152, the gate insulating layer 146, and the like. The wiring layer 156b is electrically connected to the electrode layer 142b through an opening 157c formed in the insulating layer 150, the insulating layer 152, the gate insulating layer 146, and the like. In this embodiment, a wiring layer connected to the electrode layer 142a and a wiring layer connected to the low-resistance region 144a are formed using the same wiring layer 156a; however, there is no limitation to this structure. Different wiring layers may be provided as described in Embodiment 1 or 2.

Even when the wiring layer overlapping with the electrode layer and the low-resistance region penetrate the low-resistance region, electrical connection is ensured by the electrode layer in contact with a lower portion of the low-resistance region; therefore, precise alignment is not needed in formation of the opening, and a highly reliable transistor can be formed. With a structure in which a plurality of wiring layers are provided on the low-resistance region 144a side when seen from the gate electrode layer 148a, the degree of freedom of layout is increased, and the increase in the degree of integration of the semiconductor device can be achieved.

In FIGS. 8A and 8B, the transistor 160 is provided so as to overlap with at least part of the transistor 162. The source region or the drain region of the transistor 160 is preferably provided so as to overlap with part of the oxide semiconductor layer 144. Further, the transistor 162 and the capacitor 164 are provided so as to overlap with at least part of the transistor 160. With such a planar layout, the area occupied by the semiconductor device can be reduced; thus, higher integration can be achieved.

Next, an example of a circuit configuration corresponding to FIGS. 8A and 8B is illustrated in FIG. 8C.

In FIG. 8C, a first wiring (1st Line) is electrically connected to a source electrode of the transistor 160. A second wiring (2nd Line) is electrically connected to a drain electrode of the transistor 160. A third wiring (3rd Line) is electrically connected to one of a source electrode and a drain electrode of the transistor 162, and a fourth wiring (4th Line) is electrically connected to a gate electrode layer of the transistor 162. A gate electrode layer of the transistor 160 and the other of the source electrode and the drain electrode of the transistor 162 are electrically connected to one electrode of the capacitor 164. A fifth wiring (5th Line) is electrically connected to the other electrode of the capacitor 164.

The semiconductor device in FIG. 8C utilizes a characteristic in which the potential of the gate electrode layer of the transistor 160 can be held, and thus enables data writing, holding, and reading as follows.

The transistor 162 including an oxide semiconductor has extremely low off-state current; therefore, when the transistor 162 is in an off state, the potential of a node (hereinafter, a node FG) where the other of the source electrode and the drain electrode of the transistor 162, the one electrode of the capacitor 164, and the gate electrode layer of the transistor 160 are electrically connected to one another can be held for an extremely long time. The capacitor 164 facilitates holding of charge given to the node FG and reading of the held data.

Writing and holding of data are described. First, the potential of the fourth wiring is set to a potential at which the transistor 162 is turned on, so that the transistor 162 is turned on. Accordingly, the potential of the third wiring is supplied to the gate electrode layer of the transistor 160 and the capacitor 164. That is, predetermined charge is given to the gate electrode layer of the transistor 160 (writing). Here, one of two kinds of charges providing different potentials (hereinafter referred to as Low level charge and High level charge) is given. After that, the potential of the fourth wiring is set to a potential at which the transistor 162 is turned off, so that the transistor 162 is turned off. Thus, the charge given to the gate electrode layer of the transistor 160 is held (holding).

Since the off-state current of the transistor 162 is extremely low, the charge of the gate electrode layer of the transistor 160 is held for a long time.

Next, reading of data is described. By supplying an appropriate potential (reading potential) to the fifth wiring while a predetermined potential (constant potential) is supplied to the first wiring, the potential of the second wiring varies depending on the amount of charge held in the gate electrode layer of the transistor 160. This is because in general, when the transistor 160 is an n-channel transistor, an apparent threshold voltage $V_{th\_H}$ in the case where a high-level charge is given to the gate electrode layer of the transistor 160 is lower than an apparent threshold voltage $V_{th\_L}$ in the case where a low-level charge is given to the gate electrode layer of the transistor 160. Here, an apparent threshold voltage refers to the potential of the fifth wiring, which is needed to turn on the transistor 160. Thus, the potential of the fifth wiring is set to a potential $V_0$ which is between $V_{th\_H}$ and $V_{th\_L}$, whereby charge given to the gate electrode layer of the transistor 160 can be determined. For example, in the case where a high-level charge is given in writing, when the potential of the fifth wiring is set to $V_0$ ($>V_{t\_H}$), the transistor 160 is turned on. In the case where a low level charge is given in writing, even when the potential of the fifth wiring is set to $V_0$ ($<V_{th\_L}$), the transistor 160 remains in an off state. Therefore, the stored data can be read by the potential of the second wiring.

Note that in the case where memory cells are arrayed to be used, only data of desired memory cells needs to be read. In the case where such reading is not performed, a potential at which the transistor 160 is turned off, that is, a potential smaller than $V_{th\_H}$ may be given to the fifth wiring regardless of the state of the gate electrode layer of the transistor 160. Alternatively, a potential which allows the transistor 160 to be turned on regardless of a state of the gate electrode layer, that is, a potential higher than $V_{th\_L}$ may be applied to the fifth wiring.

When a transistor having a channel formation region formed using an oxide semiconductor and having extremely low off-state current is applied to the semiconductor device in this embodiment, the semiconductor device can store data for an extremely long time. In other words, power consumption can be adequately reduced because refresh operation becomes unnecessary or the frequency of refresh operation can be extremely low. Moreover, stored data can be held for a long time even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing which is a problem in a conventional nonvolatile memory, and reliability thereof is drastically improved. Furthermore, data is written by turning on or off the transistor, whereby high-speed operation can be easily realized.

Since a transistor including a material other than an oxide semiconductor can operate at sufficiently high speed, a semiconductor device in which the transistor is used in combination with a transistor including an oxide semiconductor can perform operation (e.g., reading data) at sufficiently high speed. Further, a transistor including a material other than an oxide semiconductor can favorably realize a variety of circuits (such as a logic circuit or a driver circuit) which is required to operate at high speed.

Thus, a semiconductor device having a novel feature can be achieved by being provided with both the transistor including a material other than an oxide semiconductor (in a broader sense, a transistor capable of operation at a sufficiently high speed) and the transistor including an oxide semiconductor (in a broader sense, a transistor whose off-state current is sufficiently low).

As disclosed in this specification, an electrode layer is formed to be in contact with a lower portion of an oxide semiconductor layer and treatment for adding an impurity is performed on the oxide semiconductor layer with the use of a gate electrode layer as a mask, whereby favorable electric characteristics can be maintained and the off-state current can be sufficiently reduced in the transistor 162 described in this embodiment. Then, by using such a transistor, a semiconductor device in which stored data can be held for an extremely long time can be obtained.

In the above-described transistor, the off-state current is low and the on-state characteristics (e.g., on-state current and field-effect mobility) are high, which enables high-speed operation and high-speed response of the transistor. Further, the transistor can be miniaturized. Thus, by using the transistor, a high-performance, highly reliable semiconductor device can be provided.

The structures, methods, and the like described in this embodiment can be combined as appropriate with any of the structures, methods, and the like described in the other embodiments.

Embodiment 4

In this embodiment, a semiconductor device which includes the transistor described in Embodiment 1 or 2, which can hold stored data even when not powered, which does not have a limitation on the number of write cycles, and which has a structure different from the structure described in Embodiment 3 will be described with reference to FIGS. 9A and 9B and FIGS. 10A to 10C. Note that the transistor 162 included in the semiconductor device in this embodiment is the transistor described in Embodiment 1 or 2. Any of the structures of the transistors described in Embodiment 1 or 2 can be employed for the transistor 162.

Figure 9A:
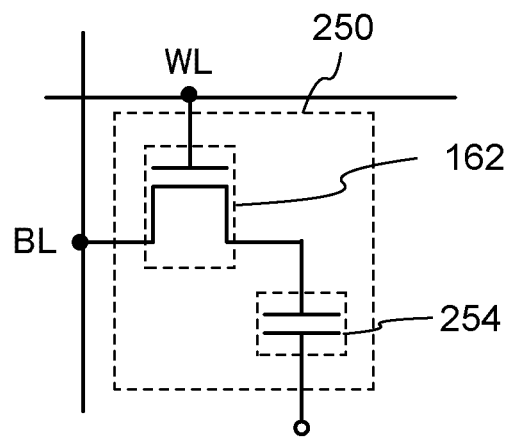
FIGS. 9A and 9B are a circuit diagram and a perspective view illustrating one embodiment of a semiconductor device.
Figure 9B:
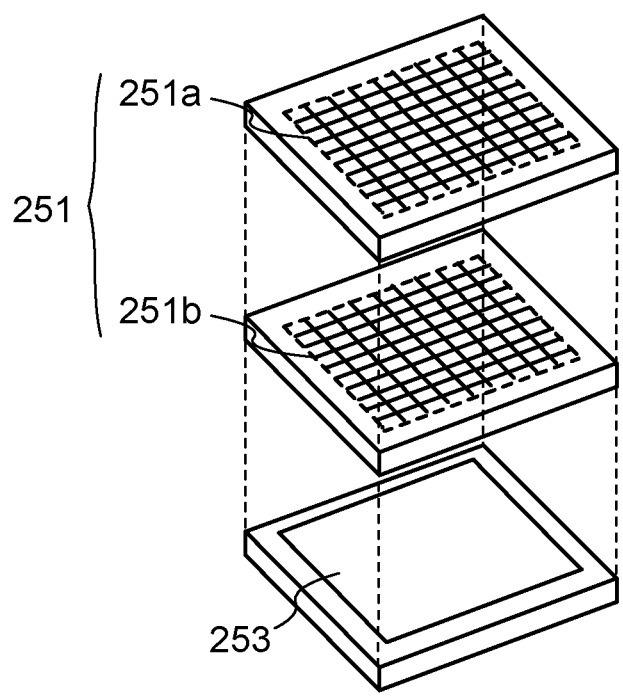

FIG. 9A illustrates an example of a circuit configuration of a semiconductor device, and FIG. 9B is a conceptual diagram illustrating an example of a semiconductor device. First, the semiconductor device illustrated in FIG. 9A is described, and then, the semiconductor device illustrated in FIG. 9B is described.

In the semiconductor device illustrated in FIG. 9A, a bit line BL is electrically connected to a source electrode or a drain electrode of the transistor 162, a word line WL is electrically connected to a gate electrode layer of the transistor 162, and the source electrode or the drain electrode of the transistor 162 is electrically connected to a first terminal of a capacitor 254.

The transistor 162 including an oxide semiconductor has extremely low off-state current. For that reason, a potential of the first terminal of the capacitor 254 (or a charge accumulated in the capacitor 254) can be held for an extremely long time by turning off the transistor 162.

Next, writing and holding of data in the semiconductor device (a memory cell 250) illustrated in FIG. 9A are described.

First, the potential of the word line WL is set to a potential at which the transistor 162 is turned on, so that the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the potential at the first terminal of the capacitor 254 is held (holding).

Because the off-state current of the transistor 162 is extremely small, the potential of the first terminal of the capacitor 254 (or the charge accumulated in the capacitor) can be held for a long time.

Next, reading of data is described. When the transistor 162 is turned on, the bit line BL which is in a floating state and the capacitor 254 are electrically connected to each other, and thus the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 9A can hold charge that is accumulated in the capacitor 254 for a long time because the off-state current of the transistor 162 is extremely low. In other words, power consumption can be adequately reduced because refresh operation becomes unnecessary or the frequency of refresh operation can be extremely low. Moreover, stored data can be held for a long time even when power is not supplied.

Next, the semiconductor device illustrated in FIG. 9B is described.

The semiconductor device illustrated in FIG. 9B includes memory cell arrays 251a and 251b including a plurality of memory cells 250 illustrated in FIG. 9A as memory circuits in an upper portion, and a peripheral circuit 253 in a lower portion which is necessary for operating a memory cell array 251 (the memory cell arrays 251a and 251b). Note that the peripheral circuit 253 is electrically connected to the memory cell array 251.

In the structure illustrated in FIG. 9B, the peripheral circuit 253 can be provided under the memory cell array 251 (the memory cell arrays 251a and 251b). Thus, the size of the semiconductor device can be decreased.

It is preferable that a semiconductor material of the transistor provided in the peripheral circuit 253 be different from that of the transistor 162. For example, silicon, germanium, silicon germanium, silicon carbide, or gallium arsenide can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably realized by the transistor.

Note that FIG. 9B illustrates, as an example, the semiconductor device in which two memory cell arrays (the memory cell arrays 251a and 251b) are stacked; however, the number of stacked memory cell arrays is not limited thereto. Three or more memory cell arrays may be stacked.

Next, a specific structure of the memory cell 250 illustrated in FIG. 9A is described with reference to FIGS. 10A to 10C.

Figure 10A:
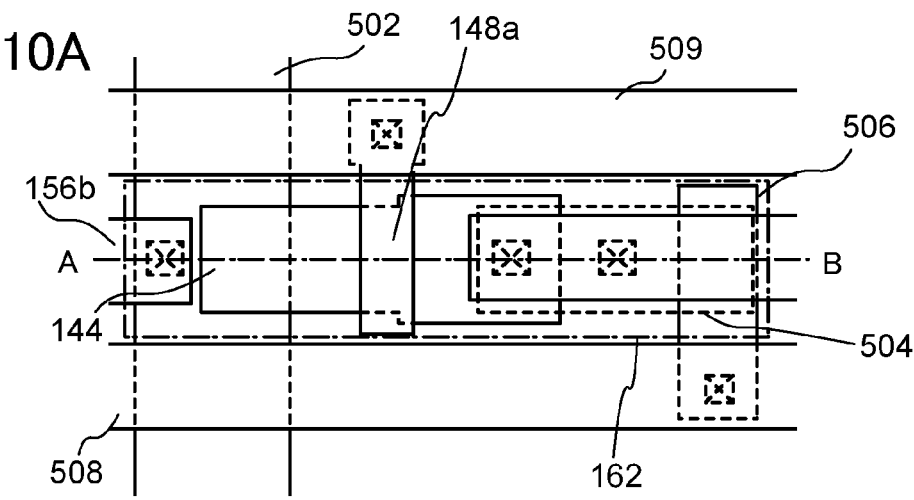
FIGS. 10A to 10C are a plan view and cross-sectional views illustrating one embodiment of a semiconductor device.
Figure 10B:
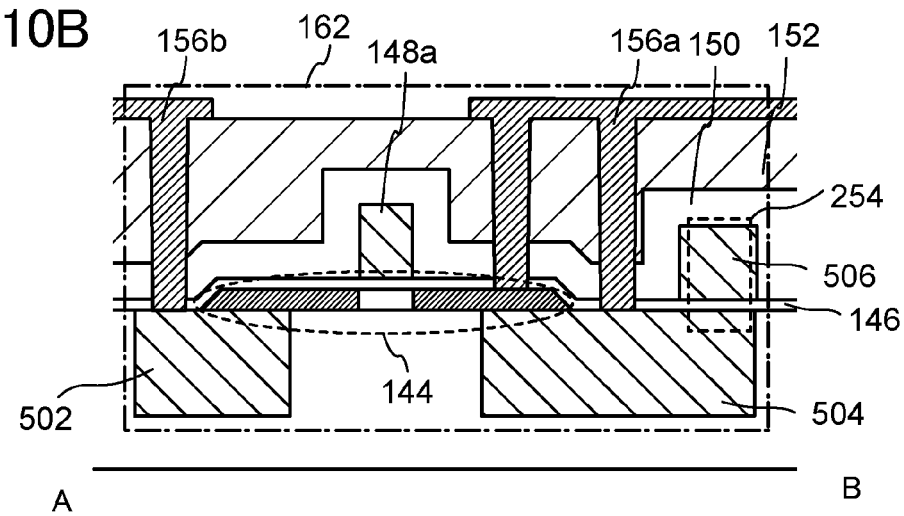
Figure 10C:
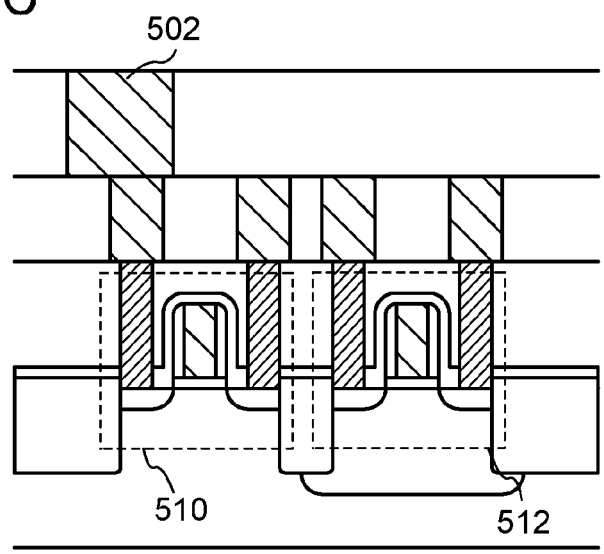

FIGS. 10A to 10C illustrate an example of a structure of the memory cell 250. FIG. 10A is a plan view of the memory cell 250. FIG. 10B is a cross-sectional view taken along line A-B in FIG. 10A.

The transistor 162 in FIGS. 10A and 10B can have the same structure as the transistor in Embodiment 1 or 2.

As illustrated in FIG. 10B, the transistor 162 is provided over an electrode 502 and an electrode 504. The electrode 502 serves as a bit line BL in FIG. 9A and is in contact with the low-resistance region of the transistor 162. The electrode 504 serves as one electrode of the capacitor 254 in FIG. 10B and is in contact with the low-resistance region of the transistor 162. In the transistor 162, an electrode 506 provided in a region overlapping with the electrode 504 serves as the other electrode of the capacitor 254.

As illustrated in FIG. 10A, the other electrode 506 of the capacitor 254 is electrically connected to a capacitor line 508. A gate electrode layer 148a over the oxide semiconductor layer 144 with a gate insulating layer 146 provided therebetween is electrically connected to a word line 509.

FIG. 10C is a cross-sectional view in a connection portion between the memory cell array 251 and the peripheral circuit. The peripheral circuit can include, for example, an n-channel transistor 510 and a p-channel transistor 512. The n-channel transistor 510 and the p-channel transistor 512 are preferably formed using a semiconductor material other than an oxide semiconductor (e.g., silicon). With such a material, the transistor included in the peripheral circuit can operate at high speed.

When the planar layout in FIG. 10A is employed, the area occupied by the semiconductor device can be reduced; thus, the degree of integration can be increased.

As described above, the plurality of memory cells formed in multiple layers in the upper portion each include a transistor including an oxide semiconductor. Since the off-state current of the transistor including a highly purified and intrinsic oxide semiconductor is low, stored data can be held for a long time owing to the transistor. In other words, the frequency of refresh operation can be significantly lowered, which leads to a sufficient reduction in power consumption. Further, as illustrated in FIG. 10B, the capacitor 254 is formed by stacking the electrode 504, the gate insulating film 146, and the electrode 506.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently low). In addition, with a structure where the peripheral circuit and the memory circuit are stacked, the degree of integration of the semiconductor device can be increased.

This embodiment can be implemented in combination with any of the other structures described in the other embodiments as appropriate.

Embodiment 5

In this embodiment, examples of application of the semiconductor device described in any of the above embodiments to portable devices such as cellular phones, smartphones, or e-book readers will be described with reference to FIGS. 11A and 11B, FIG. 12, FIG. 13, and FIG. 14.

In portable devices such as a cellular phone, a smartphone, and an e-book reader, an SRAM or a DRAM is used so as to store image data temporarily. This is because response speed of a flash memory is low and thus a flash memory is not suitable for image processing. On the other hand, an SRAM or a DRAM has the following characteristics when used for temporary storage of image data.

Figure 11A:
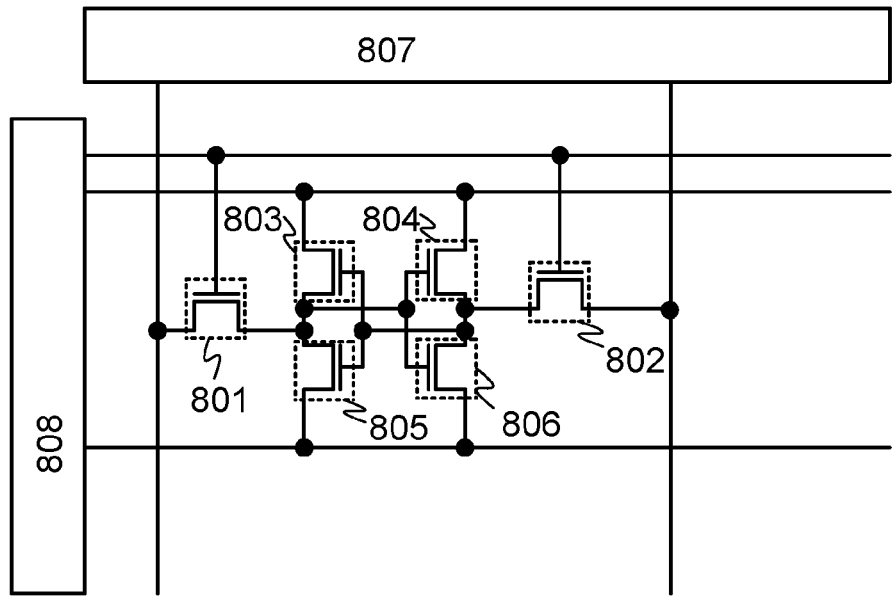
FIGS. 11A and 11B are circuit diagrams each illustrating one embodiment of a semiconductor device.

In an ordinary SRAM, as illustrated in FIG. 11A, one memory cell includes six transistors, that is, transistors 801 to 806, which are driven with an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, a price per bit of an SRAM is the most expensive among a variety of memory devices.

Figure 11B:
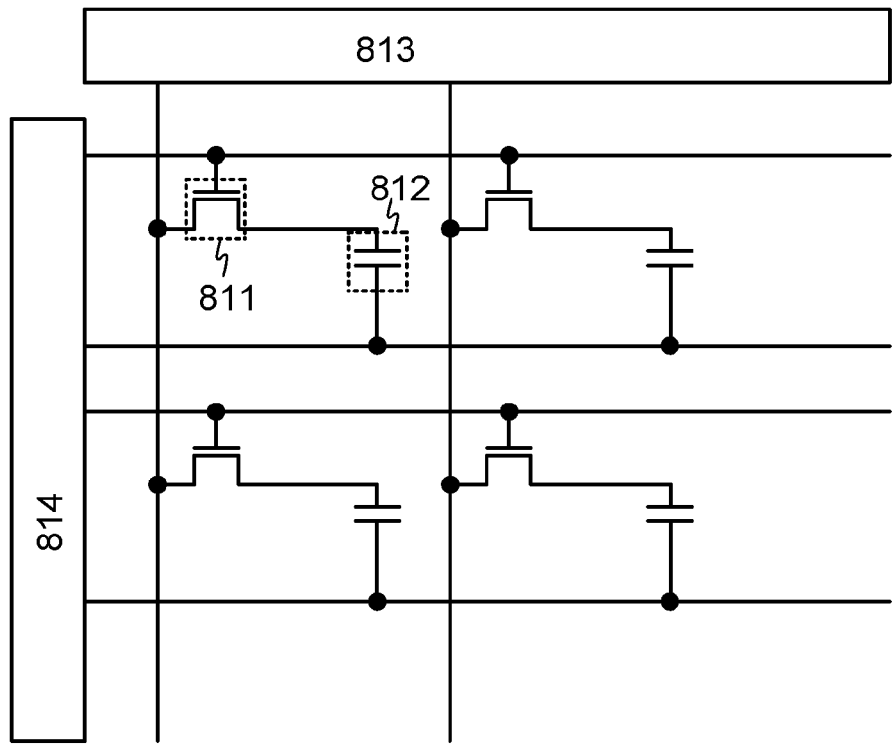

In a DRAM, as illustrated in FIG. 11B, a memory cell includes a transistor 811 and a storage capacitor 812, which are driven with an X decoder 813 and a Y decoder 814. One cell includes one transistor and one capacitor and thus the area of a memory cell is small. The area of a memory cell of a DRAM is generally less than or equal to 10 $F^2$. Note that in the case of a DRAM, a refresh operation is always necessary and power is consumed even when a rewriting operation is not performed.

However, the area of the memory cell of the semiconductor device described in any of the above embodiments is about 10 $F^2$ and frequent refreshing is not needed. Therefore, the area of the memory cell is reduced, and the power consumption can be reduced.

Figure 12:
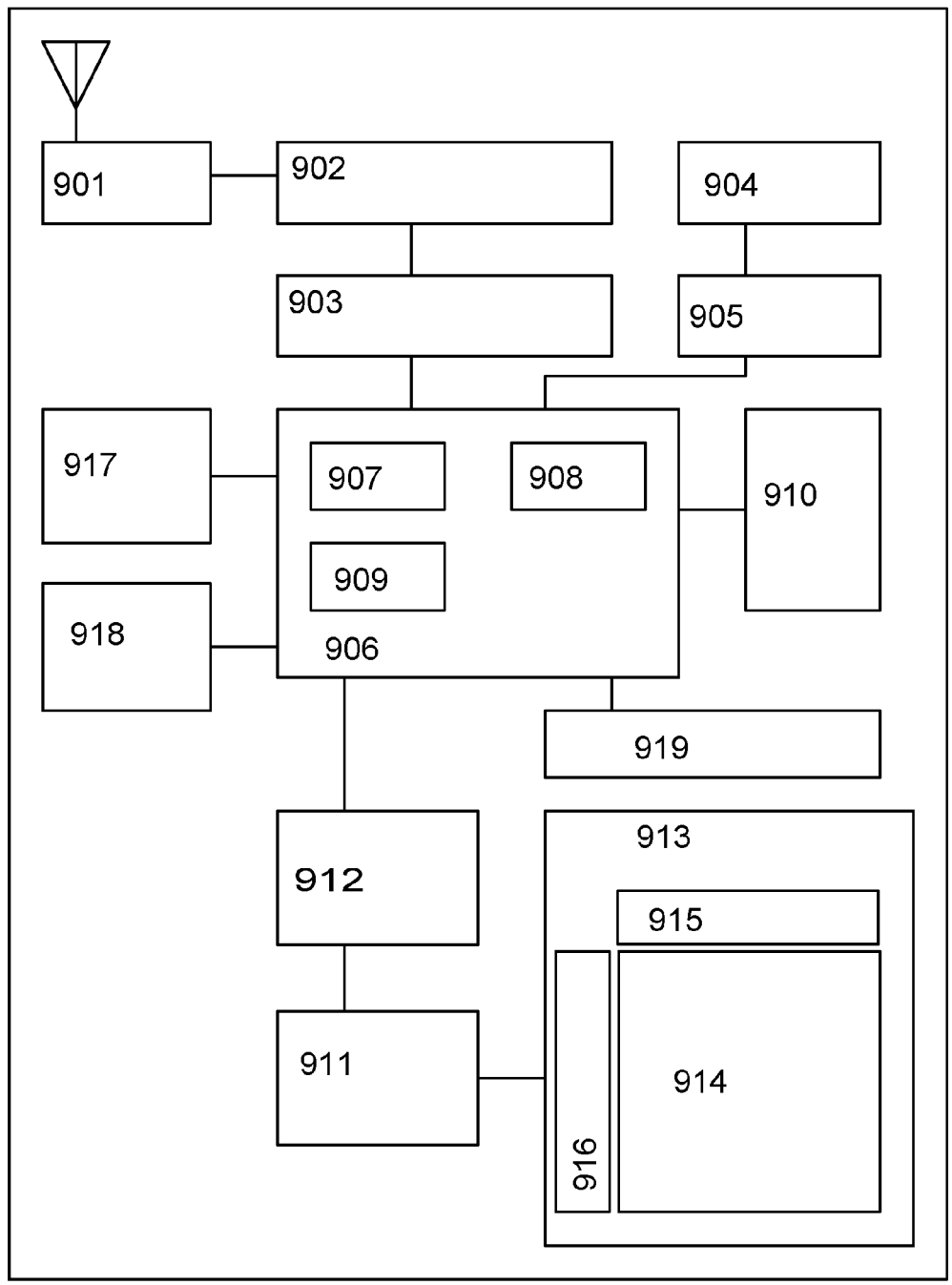
FIG. 12 is a block diagram illustrating one embodiment of a semiconductor device.

Next, FIG. 12 is a block diagram of a portable device. The portable device illustrated in FIG. 12 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 13:
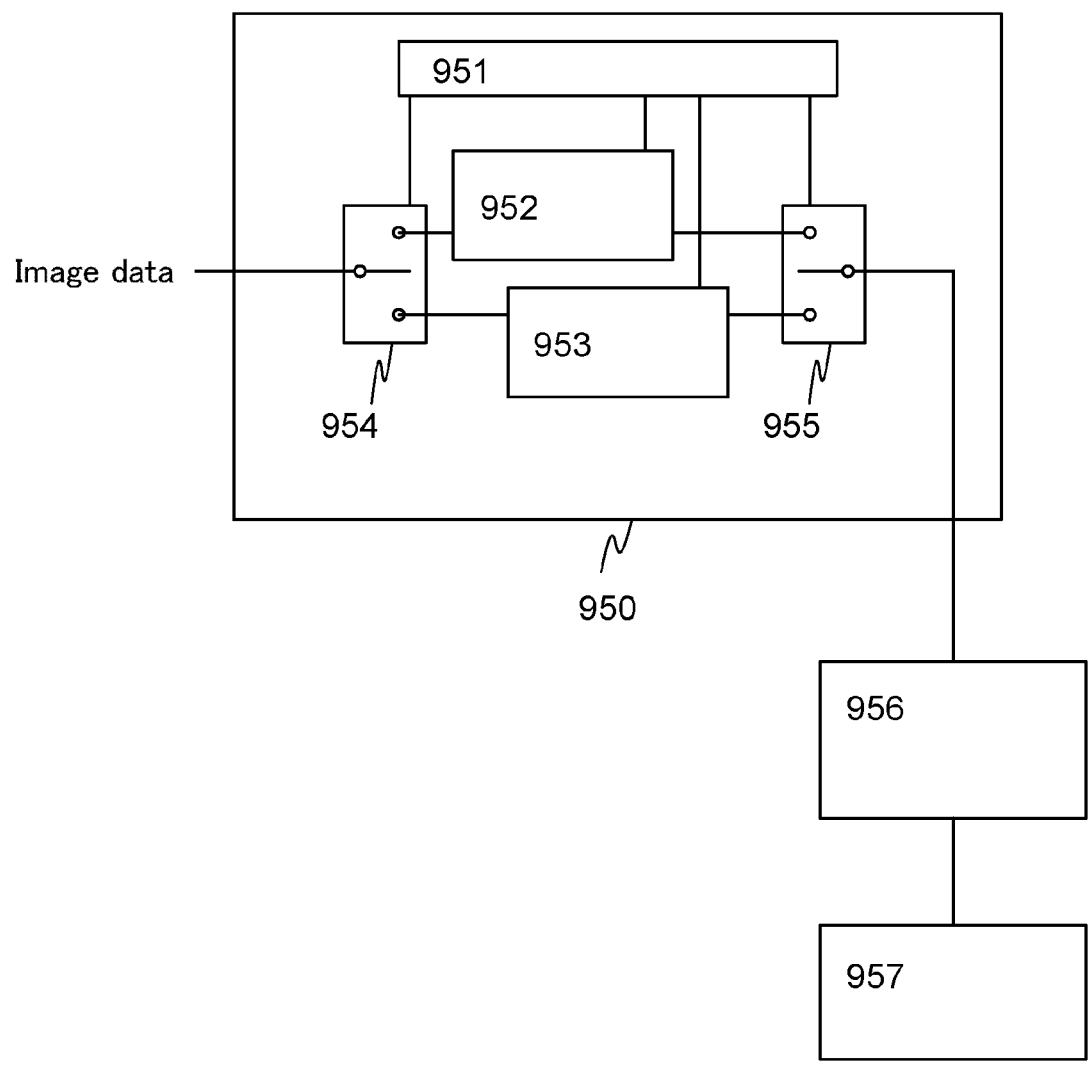
FIG. 13 is a block diagram illustrating one embodiment of a semiconductor device.

FIG. 13 illustrates an example of using the semiconductor device described in any of the above embodiments in a memory circuit 950 for a display. The memory circuit 950 illustrated in FIG. 13 includes a memory 952, a memory 953, a switch 954, a switch 955, and a memory controller 951. Further, the memory circuit is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not shown). The input image data A is held in the memory 952 through the switch 954. The image data (stored image data A) stored in the memory 952 is transmitted to the display 957 through the switch 955 and the display controller 956 and is displayed on the display 957.

In the case where the input image data A is not changed, the stored image data A is read from the memory 952 through the switch 955 by the display controller 956 normally at a frequency of approximately 30 Hz to 60 Hz.

Next, for example, when data displayed on the screen is rewritten by a user (that is, in the case where the input image data A is changed), new image data (input image data B) is formed by the application processor. The input image data B is stored in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is stored in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 14:
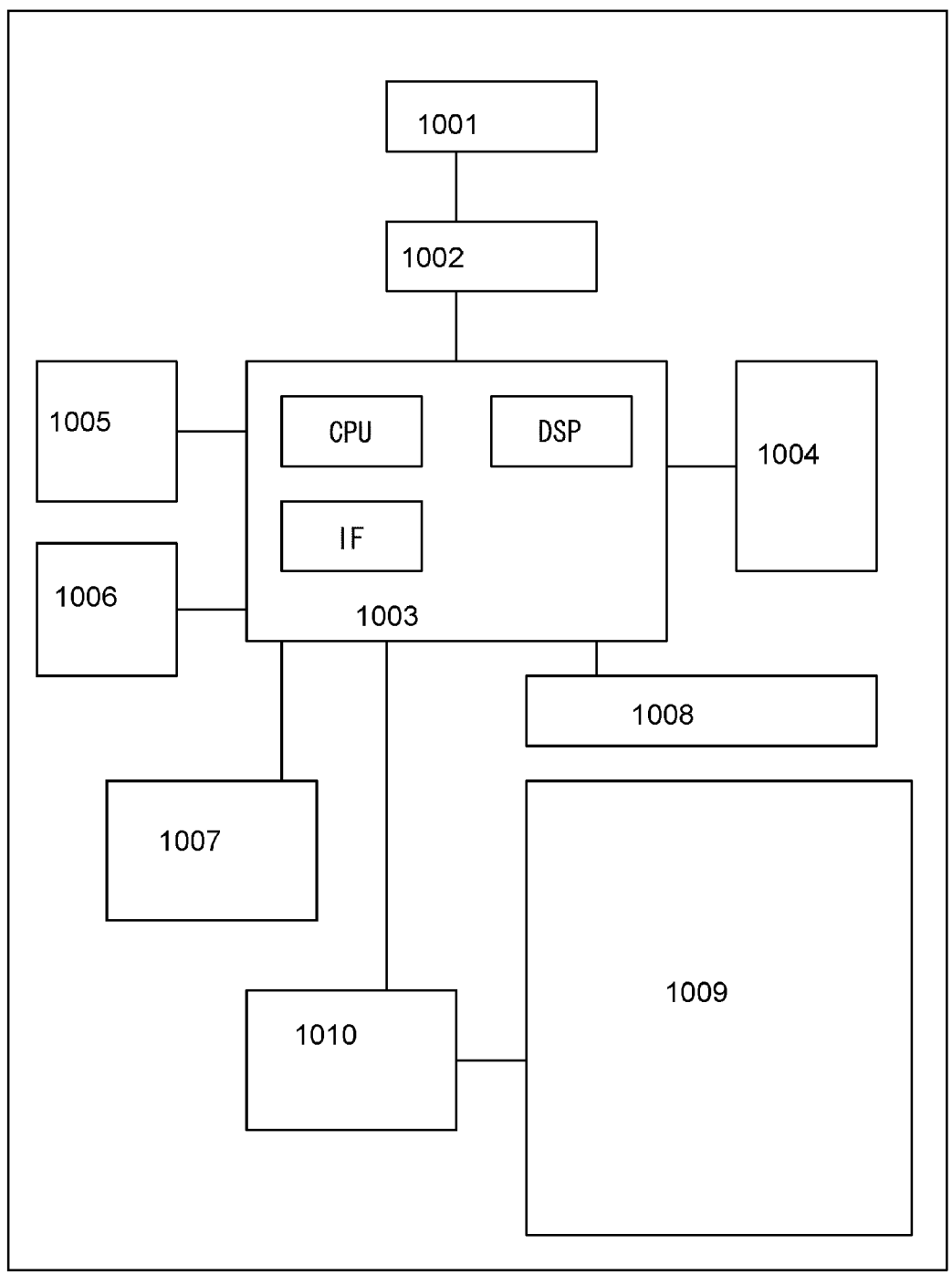
FIG. 14 is a block diagram illustrating one embodiment of a semiconductor device.

FIG. 14 is a block diagram of an e-book reader. The e-book reader in FIG. 14 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 14. The memory circuit 1007 has a function of temporarily holding the contents of a book. For example, when a user reads an e-book, the user may use a highlighting function of changing a display color, drawing an underline, using a bold font, changing the type of letter, or the like so that the specific portion is in clear contrast to the other portions. In the case where data of the portion specified by the user is held for a long time, the data may be copied to the flash memory 1004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Therefore, it is possible to obtain a portable device which is capable of reading data at high speed, holding data for a long time, and reducing power consumption.

The structures, methods, and the like described in this embodiment can be combined as appropriate with any of the other structures, methods, and the like described in the other embodiments.

This application is based on Japanese Patent Application serial no. 2011-202940 filed with Japan Patent Office on Sep. 16, 2011, the entire contents of which are hereby incorporated by reference.

What is claimed is:

1. A semiconductor device comprising:
a first conductive layer;
a first insulating layer whose side surface is in contact with a side surface of the first conductive layer;
an oxide semiconductor layer over and in contact with the first conductive layer and the first insulating layer;
a gate insulating layer over the oxide semiconductor layer;
a gate electrode layer over the oxide semiconductor layer with the gate insulating layer interposed therebetween;
a second insulating layer over the gate electrode layer;
a first wiring layer over the second insulating layer, the first wiring layer being in contact with the first conductive layer through a first opening of the second insulating layer;
a second wiring layer over the second insulating layer, the second wiring layer being in contact with the oxide semiconductor layer through a second opening of the second insulating layer; and
a third wiring layer over the second insulating layer, the third wiring layer electrically connected to the oxide semiconductor layer through a third opening of the second insulating layer,
wherein one surface of the oxide semiconductor layer is directly in contact with the first conductive layer.

2. The semiconductor device according to claim 1,
wherein the second wiring layer is in contact with a first portion of the oxide semiconductor layer,
wherein the gate electrode layer overlaps with a second portion of the oxide semiconductor layer, and
wherein the first portion is thinner than the second portion.

3. The semiconductor device according to claim 1,
wherein the oxide semiconductor layer comprises a first region, a second region, and a channel formation region between the first region and the second region,
wherein the channel formation region overlaps with the gate electrode layer, and
wherein each of a resistivity of the first region and a resistivity of the second region is lower than a resistivity of the channel formation region.

4. The semiconductor device according to claim 1, wherein the oxide semiconductor layer comprises a c-axis-aligned crystal region.

5. The semiconductor device according to claim 1, wherein the oxide semiconductor layer comprises an In—Ga—Zn-based oxide semiconductor.

6. The semiconductor device according to claim 1, wherein the first wiring layer and the second wiring layer are branched from one wiring.

7. A semiconductor device comprising:
a base insulating layer;
a first conductive layer whose bottom surface and side surface are provided in the base insulating layer and upper surface is exposed from the base insulating layer;
an oxide semiconductor layer over the base insulating layer and the first conductive layer, the oxide semiconductor layer including a first low-resistance region, a second low-resistance region, and a channel formation region between the first low-resistance region and the second low-resistance region, wherein the channel formation region is in contact with the base insulating layer and the first low-resistance region is in contact with the first conductive layer;
a gate insulating layer over the first conductive layer, the oxide semiconductor layer, and the base insulating layer;
a gate electrode layer over the gate insulating layer and overlapping with the channel formation region;
an insulating layer over the gate insulating layer and the gate electrode layer;
a first wiring layer in a first opening that overlaps with the first conductive layer and reaches the first conductive layer and reaches the first low-resistance region, the first wiring layer being in contact with the first conductive layer;
a second wiring layer in a second opening that overlaps with the first low-resistance region and reaches the first low-resistance region, the second wiring layer being in contact with the first low-resistance region; and
a third wiring layer in a third opening, the third wiring layer electrically connected to the second low-resistance region,
wherein one surface of the oxide semiconductor layer is directly in contact with the first conductive layer.

8. The semiconductor device according to claim 7, wherein the third opening faces to the second opening with the gate electrode layer interposed therebetween.

9. The semiconductor device according to claim 7,
wherein the third opening overlaps with the second low-resistance region and reaches the second low-resistance region, and
wherein the third wiring layer is in contact with the second low-resistance region.

10. The semiconductor device according to claim 7, further comprising:
a second conductive layer whose bottom surface and side surface are provided in the base insulating layer and upper surface is exposed from the base insulating layer,
wherein the oxide semiconductor layer is provided over the second conductive layer,
wherein the second low-resistance region is in contact with the second conductive layer,
wherein the third opening overlaps with the second conductive layer and reaches the second conductive layer, and
wherein the third wiring layer is in contact with the second conductive layer.

11. The semiconductor device according to claim 7, further comprising:
a second conductive layer whose bottom surface and side surface are provided in the base insulating layer and upper surface is exposed from the base insulating layer,
wherein the oxide semiconductor layer is provided over the second conductive layer,
wherein the second low-resistance region is in contact with the second conductive layer,
wherein the second opening overlaps with the first conductive layer,
wherein the third opening overlaps with the second conductive layer and the second low-resistance region and reaches the second low-resistance region, and
wherein the third wiring layer is in contact with the second low-resistance region.

12. The semiconductor device according to claim 7, further comprising:
a second conductive layer whose bottom surface and side surface are provided in the base insulating layer and upper surface is exposed from the base insulating layer,
wherein the oxide semiconductor layer is provided over the second conductive layer,
wherein the second low-resistance region is in contact with the second conductive layer,
wherein the second opening overlaps with the first conductive layer,
wherein the third opening overlaps with the second conductive layer and the second low-resistance region and reaches the second conductive layer, and
wherein the third wiring layer is in contact with the second conductive layer.

13. The semiconductor device according to claim 7, wherein the oxide semiconductor layer comprises a c-axis-aligned crystal region.

14. The semiconductor device according to claim 7, wherein the same potential is supplied to the first wiring layer and the second wiring layer.

15. The semiconductor device according to claim 7, wherein the oxide semiconductor layer comprises an In—Ga—Zn-based oxide semiconductor.

* * * * *